United States Patent [19]
Kirol et al.

[11] Patent Number: 5,477,706
[45] Date of Patent: Dec. 26, 1995

[54] HEAT TRANSFER APPARATUS AND METHODS FOR SOLID-VAPOR SORPTION SYSTEMS

[75] Inventors: Lance D. Kirol; Uwe Rockenfeller, both of Boulder City, Nev.

[73] Assignee: Rocky Research, Boulder City, Nev.

[21] Appl. No.: 327,150

[22] Filed: Oct. 21, 1994

Related U.S. Application Data

[63] Continuation of Ser. No. 59,548, May 11, 1993, which is a continuation-in-part of Ser. No. 794,501, Nov. 19, 1991, Pat. No. 5,271,239.

[51] Int. Cl.[6] .............................. F25B 17/00; F25B 17/08
[52] U.S. Cl. .................... 62/480; 62/112; 62/101
[58] Field of Search ........................... 62/101, 106, 112, 62/480, 477, 479, 485

[56] References Cited

U.S. PATENT DOCUMENTS

| | | | |
|---|---|---|---|
| 1,908,413 | 5/1933 | Elfving | 62/480 |
| 1,954,056 | 4/1934 | Miller | 62/480 |
| 2,236,575 | 4/1941 | Kogel | 62/106 |
| 2,257,735 | 10/1941 | Kleen | 62/480 |
| 2,276,947 | 3/1942 | Kleen | 62/480 |
| 2,340,886 | 2/1944 | Af Kleen | 62/480 |
| 2,340,887 | 2/1944 | Kleen | 62/480 |
| 2,353,713 | 7/1944 | Kleen | 62/480 |
| 2,353,714 | 7/1944 | Kleen | 62/118 |
| 2,370,643 | 3/1945 | Kleen | 62/480 |
| 2,374,184 | 4/1945 | Kleen | 62/118 |
| 2,393,241 | 1/1946 | Kleen | 62/480 |
| 2,401,233 | 5/1946 | Kleen | 62/480 |
| 2,461,262 | 2/1949 | Kleen | 62/480 |
| 2,513,148 | 6/1950 | Coons | 62/476 |
| 2,528,004 | 10/1950 | Kleen | 62/480 |
| 2,539,986 | 1/1951 | Brace | 62/476 |
| 2,587,996 | 3/1952 | Gross | 62/101 |
| 3,661,200 | 5/1972 | McNamara | 165/42 |
| 3,742,727 | 7/1973 | Kaiser | 62/476 |
| 4,183,227 | 1/1980 | Bouvin | 62/480 |
| 4,765,395 | 8/1988 | Paeye et al. | 165/104.12 |
| 5,025,635 | 6/1991 | Rockenfeller et al. | 62/106 |
| 5,157,937 | 10/1992 | Choung et al. | 62/324.2 |
| 5,272,891 | 12/1993 | Erickson | 62/477 |

FOREIGN PATENT DOCUMENTS

| | | |
|---|---|---|
| 2679633 | 1/1993 | France . |
| 3509564 | 9/1986 | Germany . |
| WO9222776 | 12/1992 | WIPO . |

OTHER PUBLICATIONS

English Translation of French Patent No. 2679633.
English Translation of German Patent No. DE3509564 Abstract.

Primary Examiner—Henry A. Bennett
Assistant Examiner—William C. Doerrler
Attorney, Agent, or Firm—Jerry R. Seiler

[57] ABSTRACT

In a sorption reaction system comprising one or more first reactors in which a refrigerant is alternately adsorbed and desorbed, and one or more second reactors in which a refrigerant is alternately desorbed and adsorbed, respectively, and having a cooling loop for directing heat transfer fluid to and from said reactors, a method of cooling an adsorbing reactor comprises directing liquid phase heat transfer fluid having a phase change from liquid to gas at a temperature at or below the temperature of adsorption to an adsorbing reactor in heat exchange exposure to the adsorbent utilizing vaporized heat transfer fluid for driving the liquid heat transfer fluid in the cooling loop. The refrigerant may be used as the heat transfer fluid. The invention includes apparatus for carrying out the method.

87 Claims, 8 Drawing Sheets

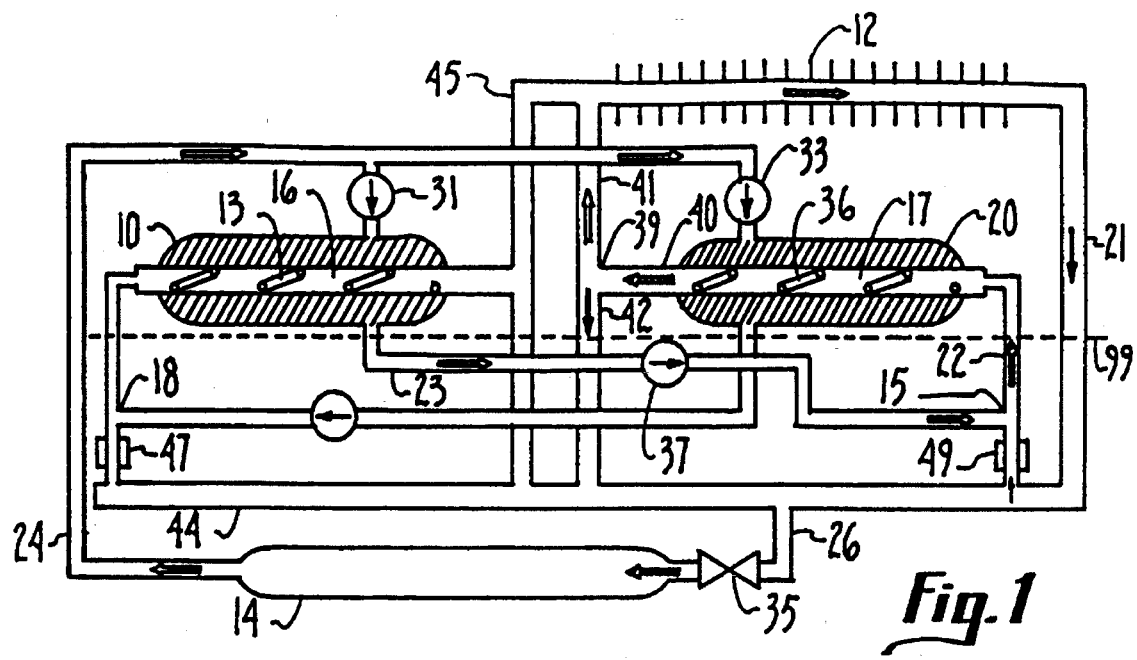
Fig.1
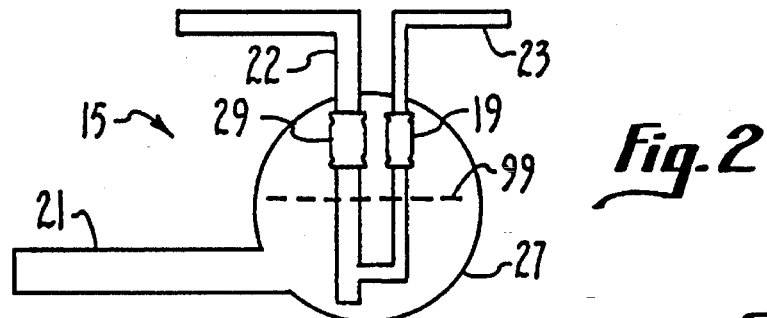
Fig.2
Fig.4
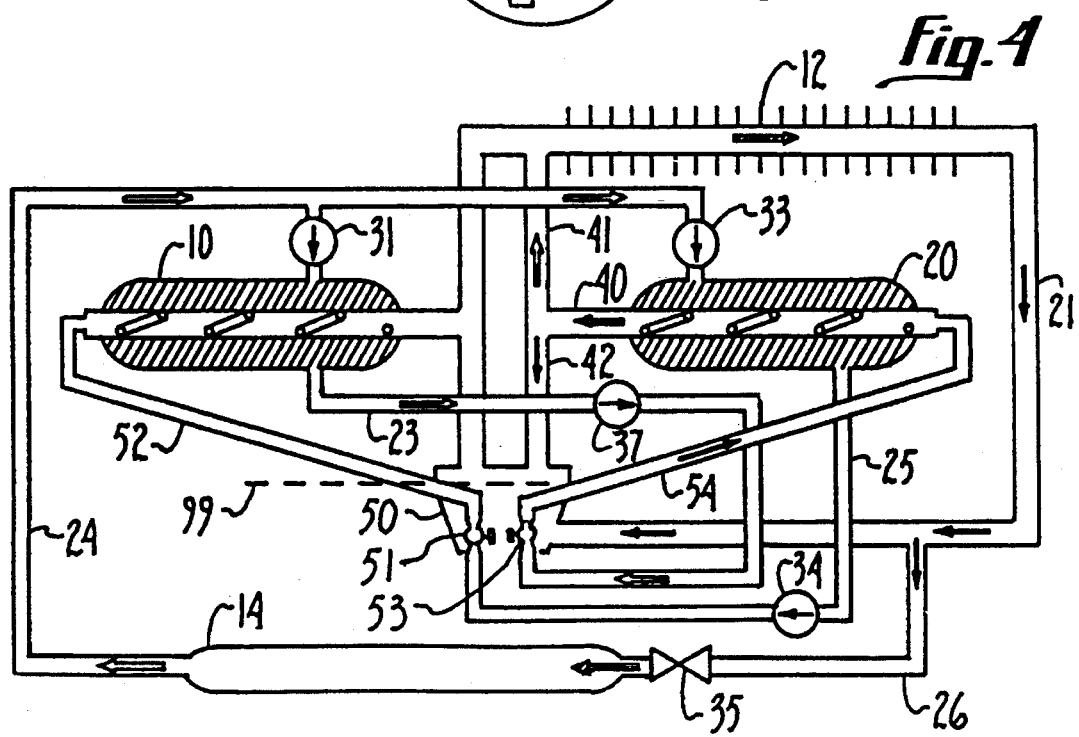

HEAT TRANSFER APPARATUS AND METHODS FOR SOLID-VAPOR SORPTION SYSTEMS

This application is a continuation of application Ser. No. 08/059,548, filed May 11, 1993, which is a continuation-in-part of application Ser. No. 07/794,501 filed Nov. 19, 1991, now U.S. Pat. No. 5,271,239.

BACKGROUND OF THE INVENTION

Solid-vapor sorption systems, such as those described in the aforesaid application, are used for cooling and refrigeration. These systems range from small devices having a cooling power of a few watts, to relatively large systems producing megawatts of cooling. The larger systems, for example used in commercial HVAC applications, are usually designed to reject heat by using heat transfer fluids directed to air coils, air-cooled condensers, evaporative condensers, cooling towers, or to ground or surface water. Pumped loops for transferring sorber heat to such heat rejection means are well-known to those skilled in the art. However, in relatively small systems, such as appliances disclosed in U.S. Pat. No. 5,161,389, and in apparatus for electronic cooling disclosed in aforesaid application Ser. No. 07/794,501, the use of extra cooling loops, and/or pump loops for transferring sorber heat to heat rejection is not practical.

In operating sorption systems described in the aforesaid patent and co-pending application as well as other sorption systems in which a gaseous reactant is adsorbed on a solid reactant, suitable components must be provided to reject heat. Systems in which the gaseous reactant is alternately adsorbed on and desorbed from the adsorbent provide two sources of heat which must be rejected during continuous operation: heat of condensation of the refrigerant, and heat of adsorption at the adsorbing reactor. Preferably, means for rejecting heat to the atmosphere with no or minimal electrical power consumption are provided. For example, heat of condensation can usually be rejected in an air-cooled condenser, using natural or forced convection over the condenser coil.

In the sorption solid-vapor reaction system using single or multiple sorbers to alternately adsorb and desorb refrigerant, conflicting heat transfer requirements must be considered and satisfied. In the desorption phase, it is desirable to utilize all of the energy from the heating means for driving the desorption reaction. The sorber may be insulated or otherwise provided with means for minimizing the heat loss since any heat losses to the environment reduce overall system efficiency and increase size and capacity requirements of the heat source. On the other hand, during the adsorption phase, efficient heat removal from the sorber is necessary, and must be transferred from the sorber to a heat rejection component, or be rejected directly from the sorber itself. The problem is exacerbated by the fact that elevated desorption temperatures create sorber-to-ambient temperature differentials favoring heat losses precisely at the time when such heat loss is undesirable.

SUMMARY OF THE INVENTION

In our aforesaid copending application Ser. No. 07/794, 501 there is disclosed an invention of using expanding vaporized heat transfer fluid from a desorbing reactor for directing or driving liquid heat transfer fluid to an adsorbing reactor for heat rejection of the exothermic reaction therein. The heat transfer fluid is a phase-change composition whereby condensed or liquid phase heat transfer fluid in contact with the adsorbing reactor heat transfer surfaces is vaporized thereby assisting in cooling the reactor and rejecting heat therefrom. The disclosure of our aforesaid copending application Ser. No. 794,501 relating to such heat transfer including the methods and apparatus described therein are incorporated herein by reference. The present invention is directed to improved systems and methods of using such means for rejecting heat from an adsorbing reactor in solid-vapor sorption systems as described above. The present invention is directed to solid-vapor sorption systems providing heat transfer to heat rejection components separate from the sorber. The systems include apparatus in which the system refrigerant is used as the heat transfer fluid for cooling an adsorbing reactor. The systems of the invention include activation of a heat rejection loop for cooling an adsorbing reactor using displacement of the heat transfer fluid without requiring thermostat or solenoid valve control of the cooling loop. Apparatus is also disclosed for transferring heat from a single heat source to either of two reactors to provide continuous refrigeration or cooling. The systems, apparatus, components and methods for achieving the improvements according to the invention will be evident from the following detailed description.

DESCRIPTION OF THE DRAWINGS

FIG. 1 schematically illustrates a solid-vapor sorption system incorporating a bubble-pump assisted thermosyphon for transferring sorption energy to a condenser;

FIG. 2 is an enlarged view showing a flexible bubble-pump connector;

FIG. 4 illustrates a solid-vapor sorption system incorporating an ejector-pump assisted thermosyphon;

DETAILED DESCRIPTION OF THE INVENTION

Figure 3:
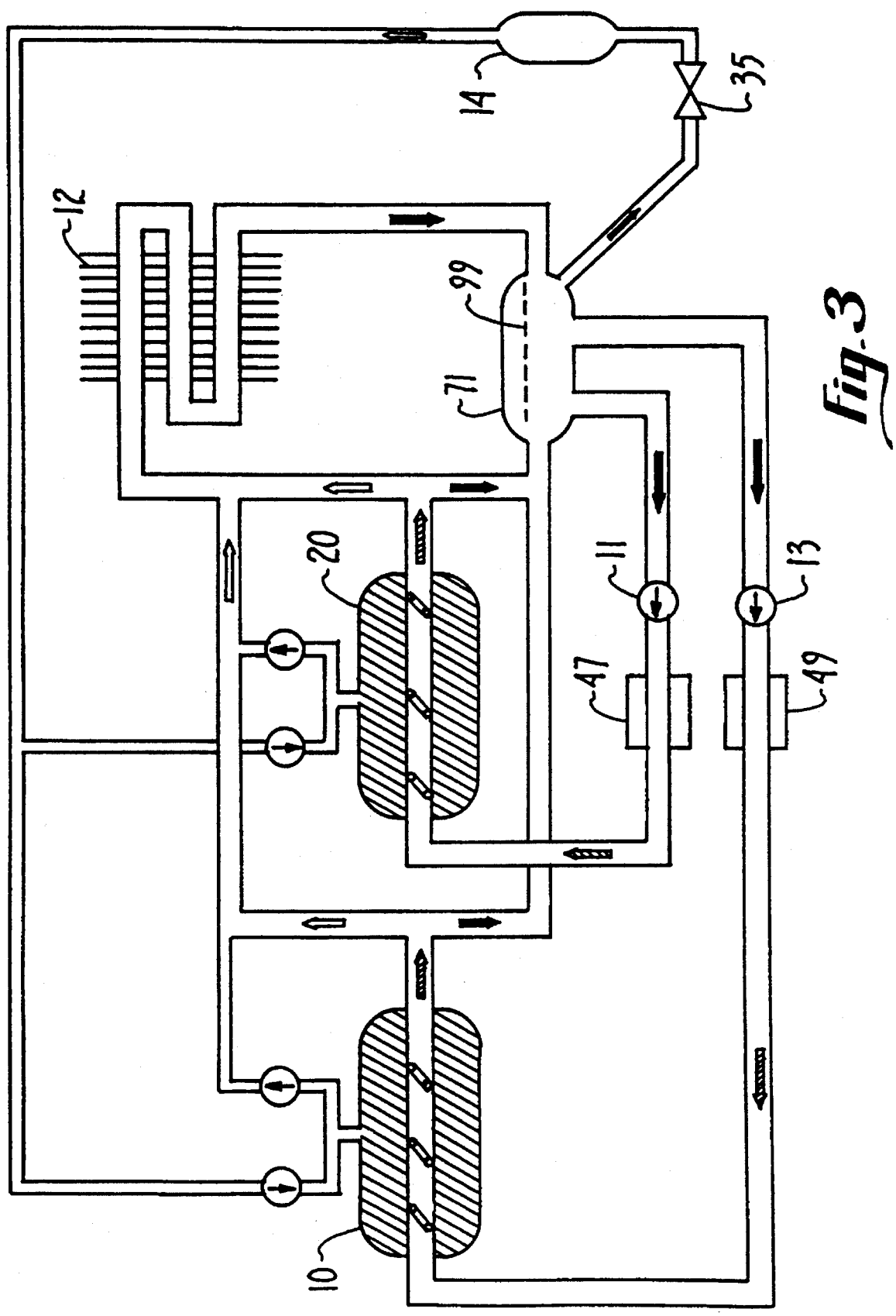
FIG. 3 illustrates a system incorporating a vapor pump comprising a heater and check valve.

The systems and apparatus disclosed herein may be used for any solid-vapor sorption including the complex compound systems disclosed in the aforesaid applications, the disclosures thereof which are incorporated herein by reference. The systems of the invention may also be used for other solid-gas adsorbents including metal hydrides, activated carbons, silica gel, zeolites, carbonates, oxides, etc., and may be used for adsorbing any suitable refrigerant-gaseous reactants such as hydrogen, methane, ethane, helium, HFCs and HCFCs. However, the systems herein are especially suitable for complex compound sorber systems of the aforesaid type for adsorbing polar refrigerants such as ammonia, water, methanol, alkanolamines, alkylamines, sulfur dioxide and phosphine on solid metal salts. Such complex compound reactor systems are especially useful in the design of small, compact devices operating at high power densities as described in co-pending application Ser. No. 07/931,036, filed Aug. 14, 1992 and 07/975,973 filed Nov. 13, 1992, and incorporated herein by reference, and specifically using the complex compounds having increased reaction rates formed by restricting the volumetric expansion thereof during adsorption of the polar refrigerant on the metal salt as disclosed therein, which complex compounds, reaction products, methods of formation and apparatus and components used therein are also incorporated herein by reference. Accordingly, the systems and methods of the present invention preferably incorporate and use reactors containing a complex compound of one of the aforesaid polar refrigerants, and particularly preferred ammonia, adsorbed on a metal salt comprising a halide, nitrate, nitrite, oxalate, sulfate, or sulfite of an alkali metal, alkaline earth metal, transition metal, zinc, cadmium, tin, aluminum, sodium boroflouride, or double metal chloride, and in which the volumetric expansion of the complex compound is limited or restricted during at least the initial adsorption reaction to form at least a partially coherent, cohesive, physically self-supporting reaction product capable of increased chemisorption reaction rates as compared to a complex compound formed without so limiting the volumetric expansion. Specific preferred complex compounds are listed in U.S. Pat. No. 4,848,994 and are incorporated herein by reference. Especially preferred complex compounds are those listed produced by adsorbing ammonia on $SrCl_2$, $SrBr_2$, $CaCl_2$, $CaBr_2$, $CaI_2$, $CoCl_2$, $CoBr_2$, $BaCl_2$, $BaBr_2$, $MgCl_2$, $MgBr_2$, $FeCl_2$, $FeBr_2$, $NiCl_2$, $ZnCl_2$, $SnCl_2$, $MnCl_2$, $MnBr_2$ or $CrCl_2$ or mixtures thereof while restricting the volumetric expansion of the complex compound formed during the adsorption reaction. These salts may also be mixed with a zeolite, activated carbon, activated alumina or silica gel prior to the initial ammonia adsorption. Preparation of the aforesaid preferred compounds used in the reactors of apparatus and systems of the present invention are capable of achieving maximum power density per mass of adsorbent, maximum power density per mass of reactor and maximum power density per desired or needed reactor volume. Half cycle times, i.e., adsorption or desorption reaction times of the reactions having such improved reaction rates are carried out in less than 30 minutes, preferably in less than about 20 minutes and typically between about 3 and about 15 minutes. As used herein, the term "adsorption" is intended to cover any such solid-vapor sorption reactions, regardless of whether it is termed adsorption or absorption.

The basic solid-vapor sorption systems used herein are schematically illustrated in FIGS. 1–10 incorporating two sorbers, also referred to herein as reactors, one of which is adsorbing while the other is desorbing. The adsorbing reactor or sorber to be adsorbed, is cooled to near ambient temperature to lower the vapor pressure of the absorbent therein. As the cooled adsorbent vapor pressure drops below the evaporator pressure the sorber draws refrigerant vapor from the evaporator. This flow of refrigerant from the evaporator provides the refrigeration or cooling effect of the system. The control of the flow of refrigerant to and from the adsorbing reactor may be passive, for example, using check valves or back-pressure control valves, or the flow may be actively controlled, using for example, solenoid valves, or motor or pressure operated valves. Heat created during the exothermic adsorption reaction is removed to maintain the sorber at the proper adsorption temperature. While the adsorbing reactor is cooled to initiate adsorption, the other sorber is heated until the vapor of the adsorbent therein is greater than the condenser pressure, at which time refrigerant desorption to the condenser begins. Heat supplied to the desorption reactor provides the necessary energy required to drive the endothermic desorption and to overcome heat loss in the system. At the end of one sorption half-cycle or phase, the roles of the two sorbers are reversed.

The systems schematically illustrated in FIGS. 1–14 illustrate the invention of an apparatus and method of rejecting the heat of adsorption created in a reactor during adsorption. In the various apparatus embodiments shown, the systems utilize a heat transfer fluid having a phase change from liquid to gas at or below the temperature of the adsorbing reactor. The heat transfer fluid, which may be liquid or a mixture of liquid phase and gaseous phase, is directed to the adsorbing reactor and is exposed in heat exchange communication with the adsorbent during the exothermic adsorption reaction. The heat from the exothermic reaction is transferred to the heat transfer fluid thereby vaporizing at least a portion of the liquid phase thereof and rejecting the heat. The systems shown incorporate a thermosyphon heat transfer loop which provides or assists in circulation of the heat transfer fluid from the adsorbing reactor to the condenser. As used herein the term thermosyphon is intended to include any loop or system in which reactor cooling results from phase change of liquid heat transfer fluid or refrigerant, the condensate of which is returned to system liquid level by gravity. The systems may be designed to use the system refrigerant as the heat transfer fluid, or for use of different, separate compositions.

In the various systems illustrated herein, it is to be understood that the sorbers or reactors may incorporate internal and/or external heat transfer surfaces. The condensers may incorporate natural or forced (fan) convective cooling. Different types of expansion devices such as a capillary tube, expansion valve, orifices, porous media, etc. may be used on the evaporator inlet. The check valves or one-way valves may be replaced by active control valves, such as solenoids. The heater elements for driving the desorption reaction may be mounted on heat-transfer surfaces, as illustrated or embedded in the sorbers. Heating means may comprise electrical resistance wires or heaters, or use heat transfer liquids or hot water or steam tubes or flue-gas tubes for directing hot gases of combustion, radiant heating, or any other suitable method of thermal conductance. Thus, the specific apparatus components are shown for purposes of illustration only and the invention is not intended to be limited to the examples shown unless so stated.

In FIG. 1 there is illustrated a solid-vapor adsorption system. The system is shown in the half-cycle during which reactor 10 is desorbing while reactor 20 is adsorbing. Desorbing reactor 10 is heated by energized heating elements 13 to provide the necessary heat for driving the endothermic desorption reaction as previously described. The heat transfer surface of adsorption reactor 20 communicates with condenser 12 via conduits 40 and 41. In the system illustrated, the refrigerant is used as the gaseous reactant which is adsorbed and desorbed on the solid adsorbent, and as the heat transfer fluid for cooling the adsorbing reactor. In the schematically illustrated apparatus of FIG. 1, as well as in FIGS. 3–11, the arrows in the various conduits are shown in the direction of refrigerant flow during the aforesaid half-cycle. The clear or white centered arrows illustrate vapor refrigerant flow, the hatched arrows show a two-phase refrigerant flow, and the solid dark centered arrows indicate liquid refrigerant flow. Piping below the sorbers is filled with liquid refrigerant approximately to level 99.

With heater element 13 in sorber 10 energized, the sorbent is heated until its vapor pressure is greater than the pressure in condenser 12. At that time, refrigerant vapor flows from sorber 10 through pipe 23 and check valve 37 to vertical tube 22 which is connected to the heat transfer tube 17 in sorber 20. Vapor flowing into the vertical tube 22 creates a "bubble-pump" effect and lifts liquid refrigerant standing in the tube to the heat transfer surfaces of heat transfer tube 17. Thus, the heat transfer liquid directed into reactor 20 is a mixture of liquid and vapor phase refrigerant. As the liquid refrigerant vaporizes on the reactor heat transfer surfaces, completely or partially, it cools reactor 20 to near condenser temperature, and adsorption of the refrigerant on the sorbent begins. Heat generated by the exothermic adsorption reaction is removed by the vaporizing refrigerant, and the sorber is maintained within a few degrees of condenser temperature. The two-phase refrigerant mixture leaving reactor 20 is directed to separator 39, typically a tee in the tubing, with the vapor portion of the refrigerant directed to the condenser 12 via pipe 41, and liquid refrigerant portion returned to the tubing below the sorbers via line 42. Vaporized refrigerant is condensed in condenser 12 and returned to the liquid in the lower tubing via pipe 21. Liquid refrigerant in the lower tubing 44 is also directed via pipe 26 through expansion valve 35, to feed the evaporator 14. Gaseous refrigerant from the evaporator is directed via pipe 24 into the adsorbing reactor. One way valves 31 and 33 direct refrigerant to a reactor during the adsorption reaction phase. After completion of the above described half-cycle, the functions of the sorbers are reversed, with the heating element 13 in reactor 10 de-energized and the heating element 36 in reactor 20 energized. As the adsorbent in reactor 12 is heated sufficiently to begin desorption, the bubble-pump 18 is activated to provide cooling to reactor 10, at which time adsorption therein begins. The closed conduit loop which directs refrigerant into the adsorbing reactor, on to the condenser and back to the reactor via the bubble pump forms the thermosyphon previously referred to.

Bubble pumps, often referred to as gas-lift pumps, used to provide condensed coolant to adsorbing reactor can be driven by vapor desorbed from the opposing reactor, as described above and illustrated in FIG. 1, or can be driven by a heater, typically electrical, on the vertical riser of the pump. The heater must be located on a vertical or nearly vertical tube or pipe and below the liquid level. Such a heater located on a liquid refrigerant line generates vapor thus reducing density of the coolant in the vertical riser relative to liquid standing in the rest of the system. Thus, the reduced density coolant and vapor flow upward creating a pumping action. The advantage of using a heater instead of desorbed vapor for activation of the bubble pump is that it allows cooldown and adsorption of the reactor to begin before the opposing reactor is heated to desorption temperature and pressure. This advantage results in reduced total time for heatup and cooldown and an overall increase in the cooling power of the system. The same effect can also be achieved with a vapor pump in which a heater generates vapor in a tube of liquid heat transfer fluid or refrigerant and a check valve prevents backflow toward the system liquid reservoir, thus forcing coolant flow toward the adsorbing reactor heat transfer surface. With the check valve, the heater need not be in the vertical riser, orientation sensitivity is greatly reduced and less liquid head is required to feed the pump. Such a feature is illustrated in FIG. 3, with heaters 47 and 49 positioned downstream from check valves 11 and 13 along the conduits from liquid reservoir 71.

The system illustrated in FIG. 1 may be sensitive to orientation, because the bubble pump vapor feed must be somewhat submerged below the liquid refrigerant level, whereas the inlet to the sorber heat exchange surface at the bubble pump exit must not be submerged. Such orientation sensitivity may be substantially reduced by connecting the bubble pump on a pivot or flexible connector as illustrated in FIG. 2. As shown, the bubble pump 15 is provided with a pair of flexible or pivoting connectors 19 and 29 along pipes 23 and 22, respectively, which allow the lower portion of the connected pipes, below the connectors, to hang vertically into receiver 27, below liquid level 99.

FIG. 4 illustrates a solid-vapor adsorption system of substantially the same design shown in FIG. 1, but incorporating an ejector for delivering cooling liquid to the adsorber reactor. In the system illustrated, ejectors 51 and 53, sometimes referred to as injectors, convert kinetic energy of the vapor refrigerant stream to a pressure head for pumping liquid refrigerant to a reactor. Advantages of ejectors over the bubble pump include reduced sensitivity to orientation by using a liquid reservoir 50, preferably having a conical or spherical bottom, or a tall cylindrical reservoir in which the ejectors are submerged at any desired inclination, more robust pumping, and delivery of liquid instead of two-phase mixture to the sorber to be cooled. A pivoting or flexible downcomer cooperating with the ejector at the bottom of the reservoir may also be used to further reduce orientation sensitivity.

Figure 5:
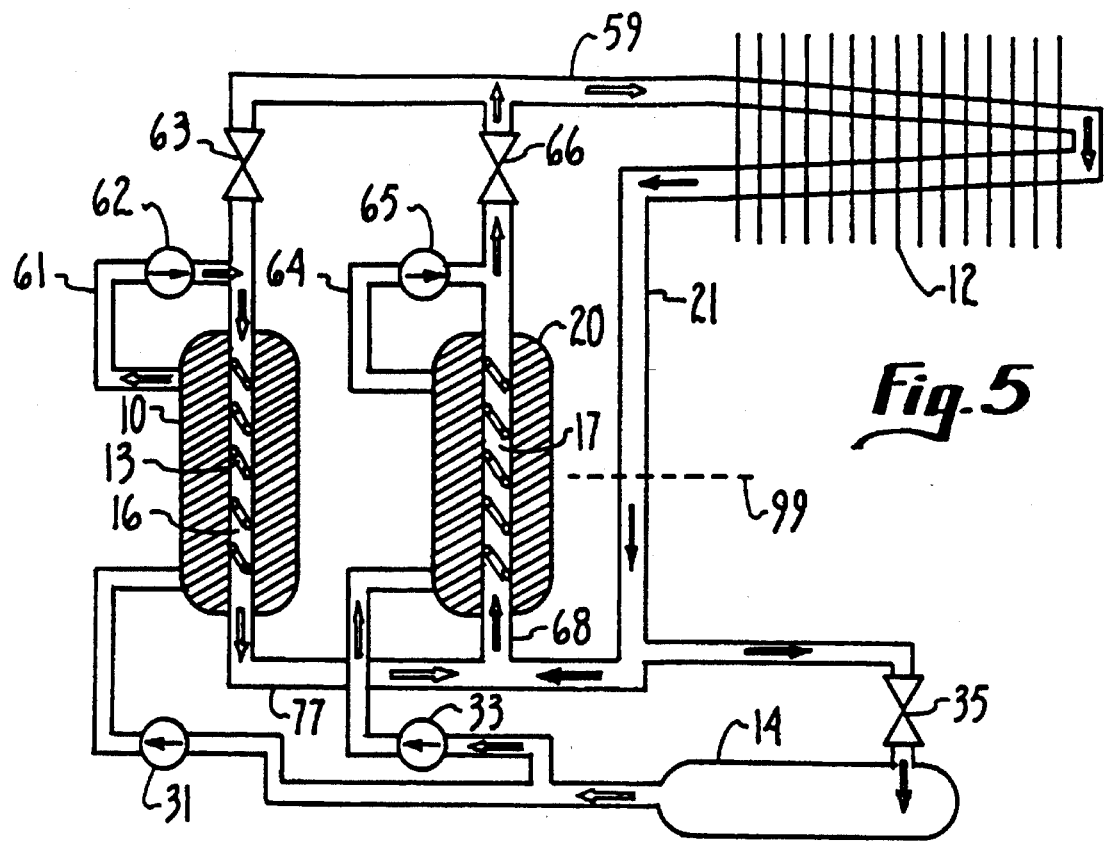
FIG. 5 illustrates a sorption system using a pressure deactivated thermosyphon.
Figure 6:
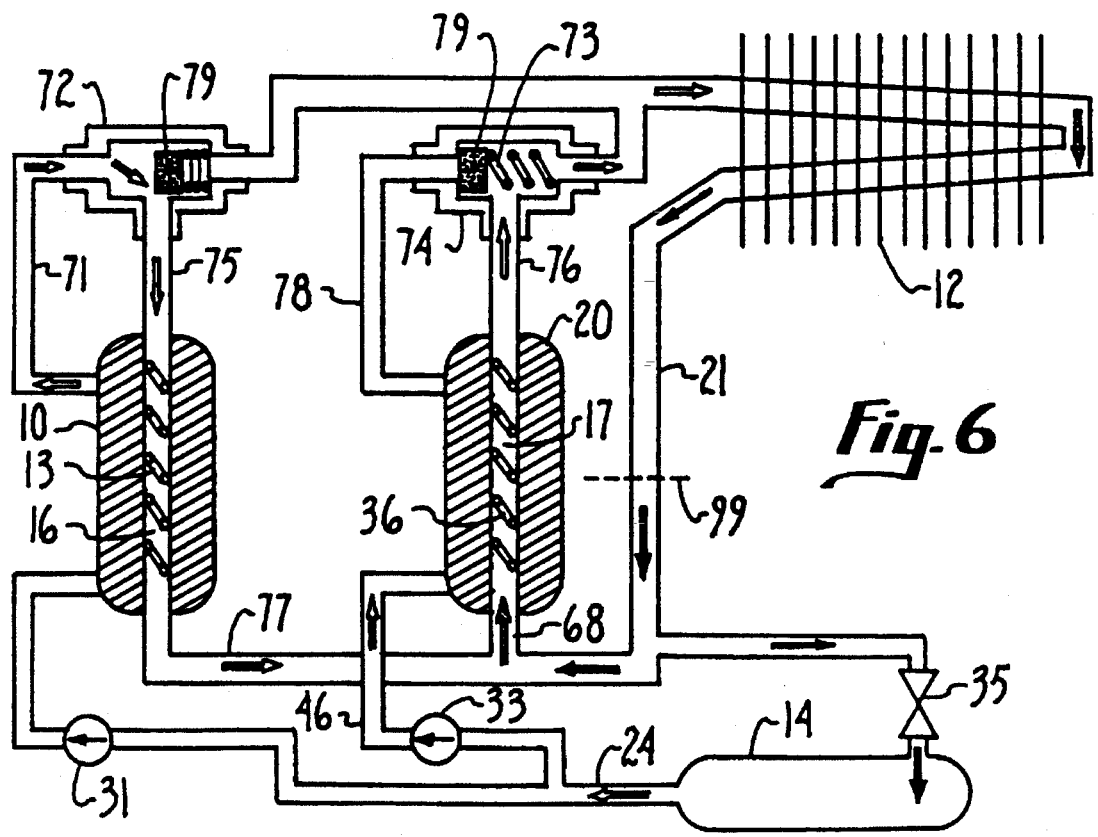
FIG. 6 illustrates sorption system incorporating a pressure deactivated thermosyphon using refrigerant pressure operated valves.
Figure 7:
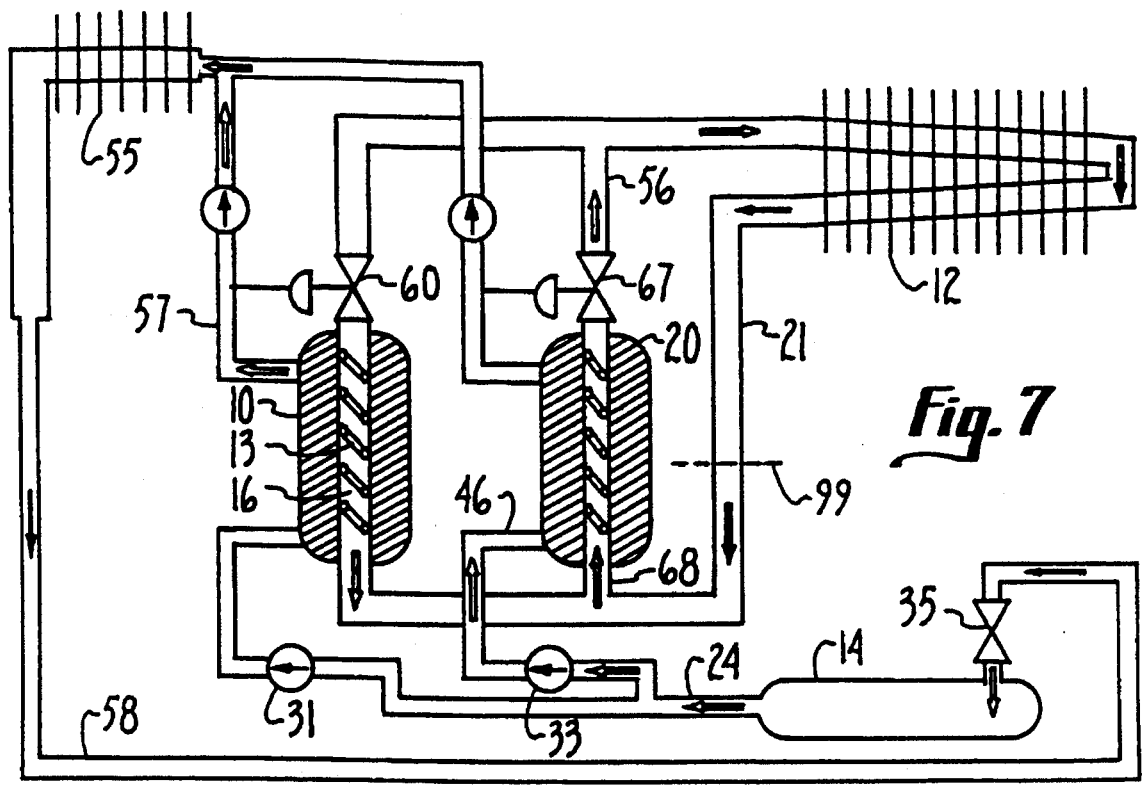
FIG. 7 illustrates sorption system using a pressure deactivated thermosyphon system incorporating separate circuits for condensing heat transfer fluid and the system refrigerant.

FIGS. 5, 6 and 7 illustrate sorption systems using a phase change thermosyphon loop for cooling either sorber. The thermosyphon loop on the sorber being desorbed is deactivated by pressure generated inside the sorber. Deactivation is accomplished by forcing all of the liquid heat transfer fluid out of the thermosyphon loop. In FIGS. 5 and 6, the system refrigerant is also the heat transfer fluid, while in FIG. 7, the system uses different refrigerant and heat transfer fluid compositions.

In FIG. 5, the schematic system shown is a pressure deactivated thermosyphon for transferring energy to the condenser. In the half-cycle illustrated, sorber 10 is desorbing with heater element 13 energized, and sorber 20 is adsorbing with its heater deenergized. Valves 63 and 66 are actively controlled. With valve 63 closed, the heat transfer tubes 16 in reactor 10 do not communicate with the condenser 12 whereby pressure generated by heat forces liquid refrigerant out of the heat transfer tube, through conduit 77, and into the heat transfer tubes of reactor 20. Initial pressure to deactivate the thermosyphon circuit is provided by the reactor heaters or by auxiliary heaters located in the thermosyphon loop which may be activated just long enough to increase vapor pressure in the loop sufficient to initiate deactivation. However, once desorption begins, pressure of the desorbed vapor maintains the circuit deactivated thereby minimizing heater energy consumed to maintain pressure in the heat transfer tube. With valve 66 open, the refrigerant may pass through the reactor 20 to the condenser and vaporization of liquid refrigerant in reactor 20 cools it to adsorption temperature whereby adsorption therein begins. Refrigerant vaporization then continues to remove heat of adsorption. Thus, open valve 66 activates a phase change thermosyphon heat transfer loop between reactor 20 and the condenser, while closed valve 63 deactivates the thermosyphon loop on the desorbing reactor 10 due to the pressure generated therein as previously described. At the end of the aforesaid half-cycle, the roles of the two sorbers are reversed, with heater in reactor 20 energized to start desorption, valve 66 is closed, the heater in reactor 10 is deenergized and valve 63 is opened. In both phases or half-cycles, refrigerant flow is controlled by valves 31, 33, 62 and 65. These valves may be one-way check valves, or may be actively operated. The actively operated or actuated valves 63 and 66 may be solenoid valves, sequenced with the same control circuits used to energize and deenergize the heaters. Alternatively, the actively controlled valves may be piston operated valves driven by air pressure or by refrigerant vapor pressure generated in the desorbing reactor.

Another variation of a pressure deactivated thermosyphon system is illustrated in FIG. 6. The system shown uses 3-way valves 72 and 73 controlled by pressure in the communicating sorber. Valves 72 and 73 are spring-operated, 3-port valves communicating between the respective sorbers and condenser 12. When the sorber pressure is less than or equal to the condenser pressure, valve plug 79 is urged to a position to close communication between the desorbing refrigerant outlet pipe and the condenser and to open the sorber heat transfer circuit to the condenser. Valve 73 is shown in that position. When a sorber is heated for desorption, the rising reactor pressure forces the valve plug in the opposite direction, closing heat transfer circuit communication with the condenser, and directing desorbing refrigerant to force liquid refrigerant from the reactor heat transfer tube 16 to reactor 20 heat transfer tube 17 via conduit 77. In the two systems illustrated in FIGS. 5 and 6, the actuated valves which communicate between the respective reactors and the condenser are preferably operated so that direct communication between a reactor and the condenser is closed as soon as the heater in the desorbing reactor is energized. Such operation ensures that liquid refrigerant in a reactor heat transfer tube is not evaporated prior to the valve closing and forcing refrigerant from the tube. For this purpose, an electrically actuated valve which can be closed at precisely the desired time is preferred. The desirability of such timing is to minimize energy consumption. Observing again FIG. 5, with valve 63 closed before desorption pressure is reached in reactor 10, heating of the refrigerant in the heat transfer tube 16 will result in vapor pressure increase therein to force liquid refrigerant from the reactor heat transfer section, without assist from sorber pressure.

The apparatus shown in FIGS. 5 and 6, may be modified for routing desorbed refrigerant vapor directly to the condenser, without passing through the reactor heat transfer section. Thus, for example, in FIG. 5, conduits 61 and 64 would communicate with conduit 59 above, or upstream from valves 63 and 66, respectively. One-way valves 62 and 65 could be replaced by using thermostatically operated valves with a sensor connected to the reactor heater for directing the desorbed refrigerant to condenser 12. Alternatively a solenoid valve could be used for the same purpose. The apparatus of FIG. 6 could be similarly modified.

In the embodiment illustrated in FIG. 7, the pressure deactivated thermosyphon system utilizes separate refrigerant and coolant (heat transfer fluid) condensers and associated fluid loops. Such system design may be preferred over the previously described systems using a single composition for both the cooling fluid and the system refrigerant and requiring only a single condenser, where it is desirable to minimize the refrigerant inventory, to allow use of a heat transfer fluid having improved heat transfer properties, or to allow the use of different pressures in the heat transfer components of the system. Examples of useful heat transfer fluids for such systems include water, alcohols, light hydrocarbons, heat transfer oils, and DOWTHERM® phase change heat transfer media.

In FIG. 7, valves 60 and 67 are closed to deactivate the thermosyphon of their respective sorbers during desorption. Thus, during the desorption half-cycle of reactor 10, with heater 13 activated, increased vapor pressure forces liquid coolant from the reactor heat transfer tube 16. Valves 60 and 67 may be operated electrically, thermostatically, or using pressure activation. As previously discussed, it is preferred that the valve communicating the desorbing reactor with the coolant condenser 12 be closed prior to energizing the desorption reaction heater in order to minimize heat losses through the vaporizing coolant. Electrically or thermostatically operated valves are preferred for such a purpose. Auxiliary heaters may be provided in the thermosyphon loop and energized just long enough to deactivate the loop until the pressure from desorption reactor heating creates sufficient vapor pressure to take over. In the system shown, a separate condenser 55 is used for condensing desorbed refrigerant vapor from a desorbing reactor. The condensed refrigerant is directed through conduit 58 and expansion valve 35 to evaporator 14, while condensed coolant is directed to the adsorbing reactor via conduit 21. Vaporized refrigerant is directed via conduit 24, valve 33 through conduit 46 to adsorbing reactor 20 in the half-cycle illustrated. Again, at the end of the described process, the functions of the two sorbers are reversed. The approximate coolant (heat transfer fluid) fill level 99 is also shown.

Figure 8:
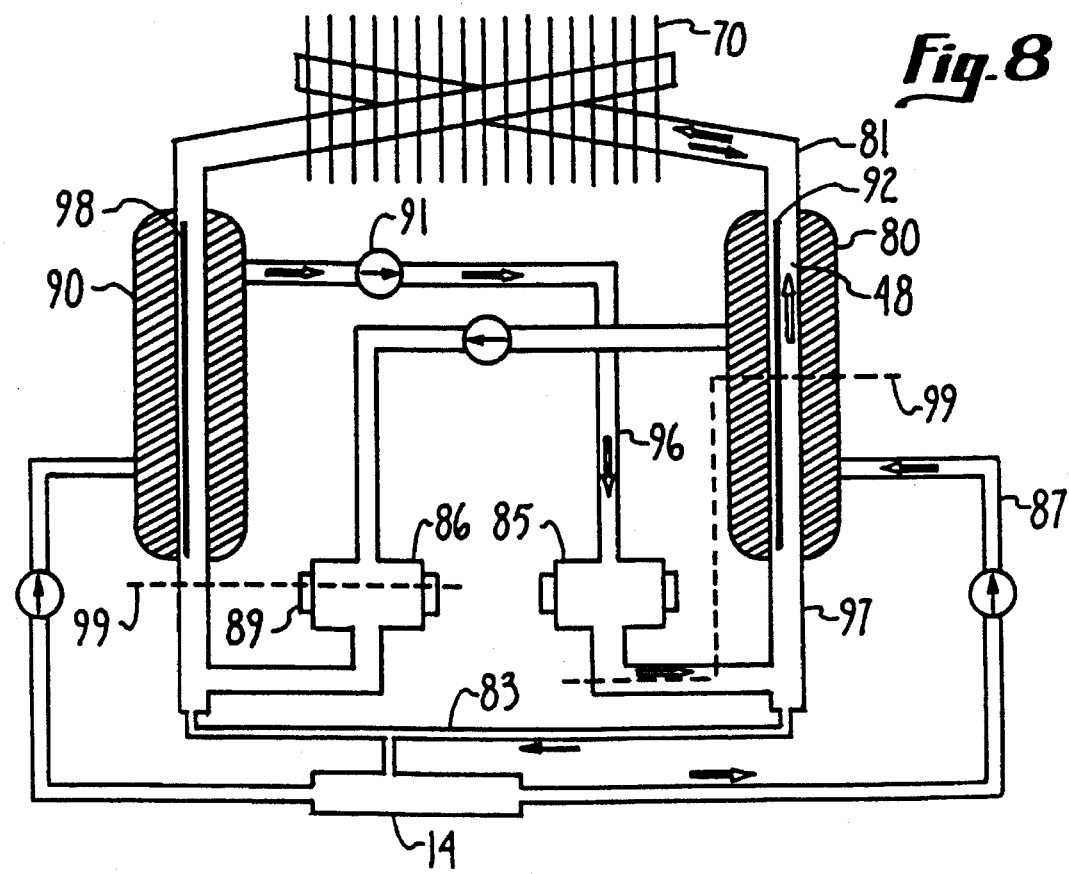
FIG. 8 illustrates a sorption system having pressure activated thermosyphon and using a single reflux type condenser for transfer of sorption energy.
Figure 9:
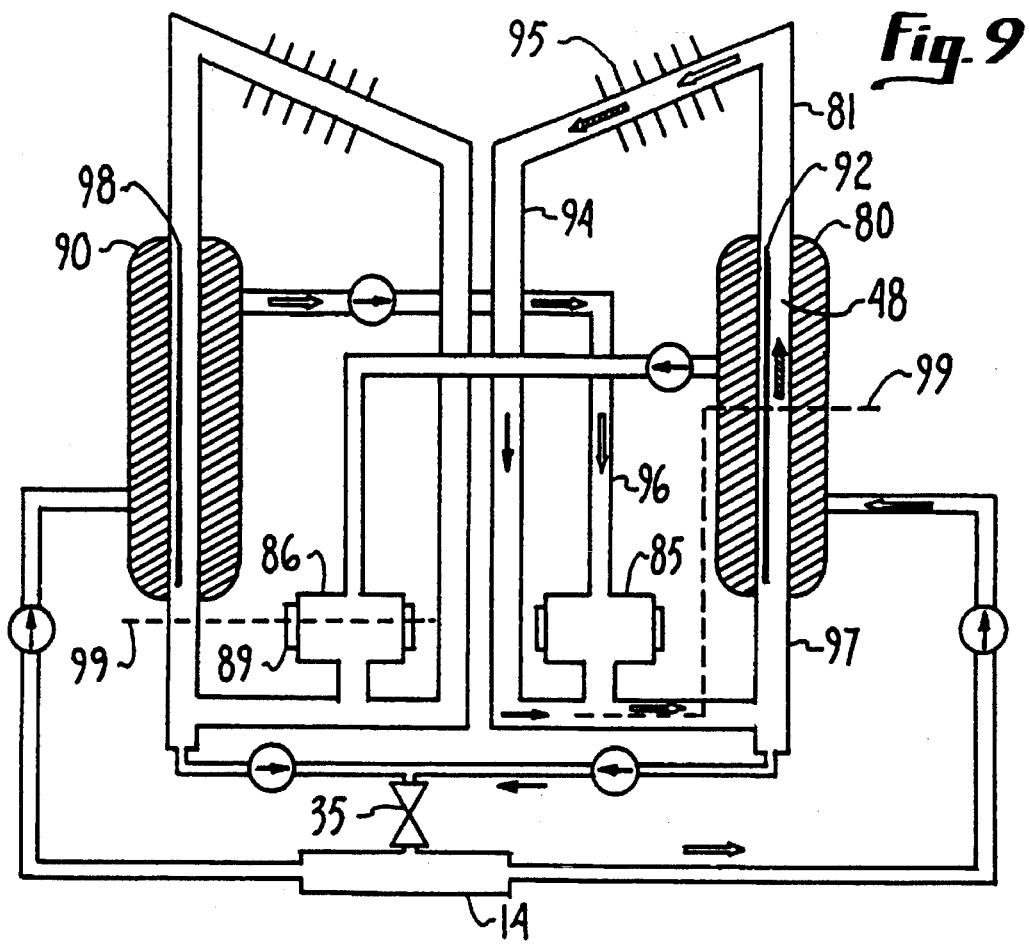
FIG. 9 shows a sorption system with a pressure activated thermosyphon incorporating separate condenser circuits for each reactor.
Figure 10:
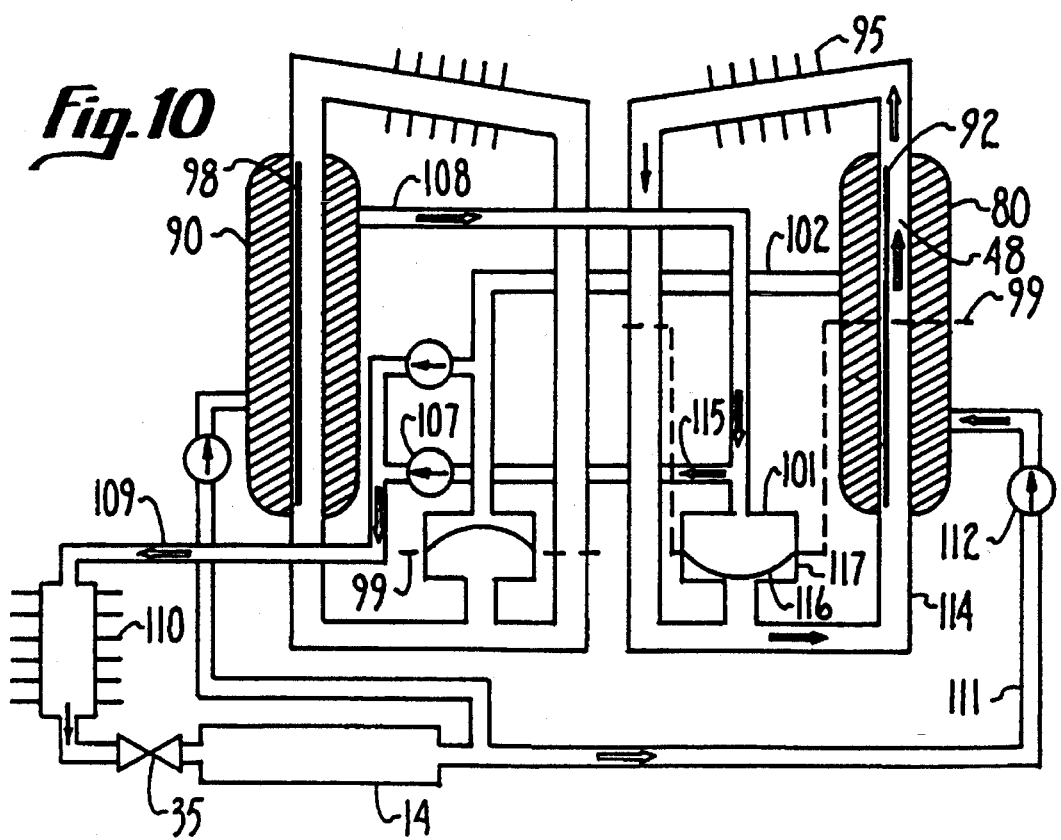
FIG. 10 shows a sorption system with a pressure activated thermosyphon incorporating separate heat transfer fluid and refrigerant condenser circuits.

In FIGS. 8, 9 and 10 sorption systems using a pressure activated thermosyphon are shown in which desorption pressure activates a heat transfer loop, in contrast to the pressure deactivated thermosyphon systems illustrated in FIGS. 5–7. The pressure activated thermosyphons provide activation of heat transfer between sorbers, i.e., one sorber activates heat rejection in the other sorber. An advantage of such a system is the reduction or elimination of timing difficulties caused by heat transfer deactivation and elimination of the loss of heater energy due to refrigerant evaporation prior to deactivation of heat transfer loop.

The pressure activated thermosyphon system illustrated in FIG. 8 incorporates a reflux type condenser 70 for condensing the refrigerant which is also the coolant or heat transfer fluid. In the operation of the half-cycle shown, reactor 90 is desorbing with vaporized refrigerant directed therefrom through one-way valve 91 and conduit 96, through reservoir 85 and into the heat transfer surface of adsorbing reactor 80 via conduit 97. The pressure from the desorbing reactor and the desorbed refrigerant forces liquid refrigerant from reservoir 85 into the heat transfer surface 48 of reactor 80, where it vaporizes and cools the reactor for removing heat of adsorption. Refrigerant vapor condensed in condenser 70 returns to reactor 80 for continuous cooling. Heating elements 92 and 98 are shown in the respective reactors, as is the liquid level 99 for the half-cycle illustrated. A capillary tube 83 or equivalent expansion device directs liquid refrigerant to evaporator 14 for expansion and direction to the adsorbing reactor via conduit 87.

An alternative to a single reflux type condenser system shown in FIG. 8 may utilize separate return legs for condensed refrigerant and for providing a thermosyphon. Such an embodiment is illustrated in FIG. 9, with reactor 90 desorbing refrigerant, and reactor 80 adsorbing in the half-cycle shown. The liquid refrigerant directed into adsorbing reactor 80 is vaporized by heat transfer along the heat transfer surfaces of heat transfer section 48, with the vaporized refrigerant directed to condenser 95. The system illustrated in FIG. 8 may also incorporate check valves and a single expansion device for feeding evaporator 14, as shown in FIG. 9, to prevent fluid migration between sides.

Yet another alternative is illustrated in FIG. 10 showing a system in which a coolant or heat transfer fluid other than the system refrigerant is used. In this embodiment, the pressure activated thermosyphon system incorporates diaphragms in the reservoirs which displace liquid coolant using pressure without mixing of the refrigerant and the coolant. In the half-cycle shown, using pressure from desorbing reactor 90, desorbed refrigerant is directed through conduit 108 into reservoir 101 where it forces diaphragm 116 to displace liquid coolant out of the lower cavity 117 and into adsorbing reactor 80 via conduit 114. Again, the vaporized liquid coolant is directed to the coolant condenser 95, and condensed liquid directed back to the reservoir 101. Refrigerant adsorbed in adsorbing reactor 80 is directed thereto from evaporator 14, and a portion of the desorbed refrigerant from reactor 90 is split off from conduit 108 via conduit 115 and one-way valve 107 and conduit 109 to refrigerant condenser 110. Other movable interface means may be substituted for the diaphragm shown. For example, bellows or pistons, etc., may be used at the liquid, gas interface for displacing liquid heat transfer fluid in response to gas pressure.

Pressure activated thermosyphon systems, with system refrigerant the same or different than coolant, may also be activated with a small heater in the coolant reservoir. Thus, small heaters 89 may be provided in reservoirs 85 and 86 of the systems shown in FIGS. 8 and 9 to generate pressure and displace the coolant into the thermosyphon loop. The advantage of using such heaters is that cooldown and adsorption can start before desorption pressure is generated in the opposing reactor, with the effect of shortening total cooldown/heatup time and increasing net system cooling capacity. As previously described as an option to the bubble pump system of FIG. 1, a heater and desorbing vapor may also be combined to provide timing advantages while minimizing energy consumption; once desorption pressure is generated in the opposing reactor, the heater may be deactivated.

The heat rejection means comprising the thermosyphon loops or circuits for cooling adsorbing reactors may be used with staged systems such as those disclosed in U.S. Pat. No. 5,079,928 and co-pending application Ser. No. 07/813,283 filed Dec. 20, 1991, the descriptions of which are incorporated here by reference. In such discrete constant pressure staged systems, thermosyphon heat transfer loops may be provided between reactors of adjacent higher and lower staged reactors. For example, in a three stage system, three thermosyphon heat transfer loops may be used, one between the intermediate and highest stage reactors, one between the intermediate and lowest stage reactor, and one between the lowest stage reactor and the condenser. For higher stage reactors, the lower stage reactors serve the function of a "heatsink" or heat transfer fluid condenser, and the lowest stage reactor rejects heat to the condenser itself. These thermosyphon loops use phase change heat transfer fluids in the thermosyphon heat transfer loops and may be provided with dual-circuit heat transfer conduits as disclosed in aforesaid copending and incorporated application Ser. No. 07/931,036. In such multiple stage reactor heat transfer circuits of three or more reactors, the lowest stage circuit may use the system refrigerant for heat transfer to the refrigerant condenser, or a different coolant and separate condenser. The higher stage reactors usually use a coolant different from the system refrigerant unless a low pressure refrigerant such as water is used.

Figure 11:
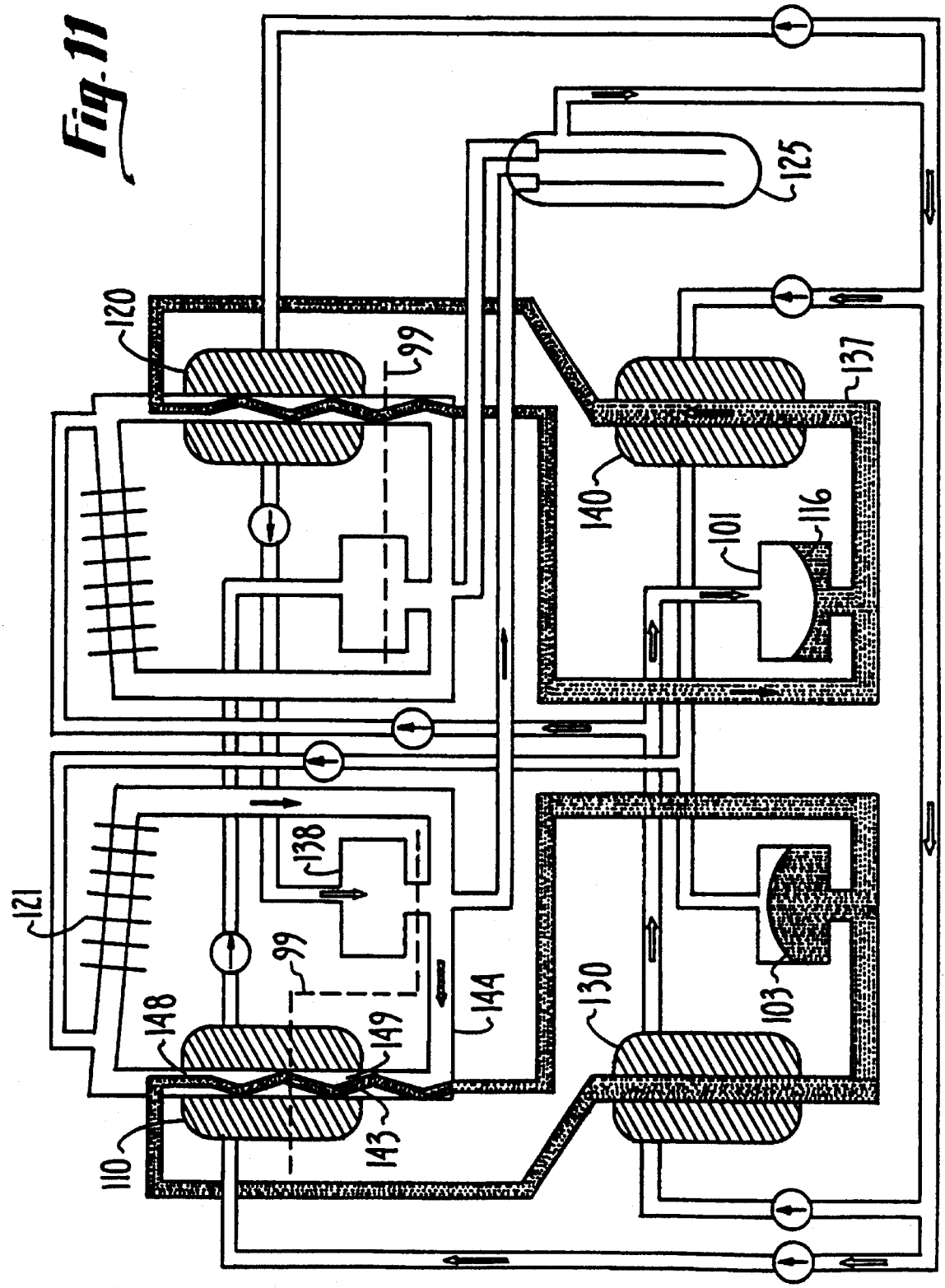
FIG. 11 shows a two-stage constant pressure engine staging system with a pressure activated thermosyphon on both stages.

In FIG. 11, a two-stage discrete constant pressure staging system is shown. It will be noted that the schematically illustrated system is similar in design to the systems illustrated in FIGS. 7 and 8 incorporating pressure activated thermosyphon loops used on both stages. In the illustrated system, reactors 110 and 120 are the lower stage (cooler) reactors and reactors 130 and 140 are the higher stage (hotter) reactors. It will also be noted that the higher stage reactors 130 and 140 use a coolant other than the refrigerant whereas the lower stage reactors 110 and 120 use system refrigerant as the coolant for rejecting heat to the condenser 121. The lower stage sorbers may incorporate dual-circuit heat transfer section components such as illustrated and described in application Ser. No. 07/931,036, and incorporated herein by reference. Alternatively, the heat transfer section 148 may be designed for heat transfer fluid condensation in a small tube 143 coiled inside of a larger tube 149 containing the heat rejection fluid, such as schematically illustrated in reactors 110 and 120.

The system illustrated in FIG. 11 shows a half-cycle with reactor 120 desorbing while reactor 140 is adsorbing refrigerant. In staged reactors 110 and 130, reactor 110 is adsorbing refrigerant while reactor 130 is desorbing. Desorbing reactor 130 directs refrigerant vapor to reservoir 101 expanding diaphragm 116 and displacing the liquid heat transfer fluid therein. The heat transfer fluid is shown stippled. The liquid heat transfer fluid is directed into adsorbing reactor 140, where it is vaporized, cooling the reactor. From there the vaporized heat transfer fluid is directed to lower stage desorbing reactor 120 and is condensed at the lower temperature conditions therein. The vaporized refrigerant desorbed in reactor 120 is directed through reservoir 138 and mixes with liquid condensed refrigerant in conduit 144. The mixture is then directed into reactor 110 by the activated thermosyphon loop created in heat transfer section 148 to provide heat transfer cooling. In the apparatus and system illustrated, refrigerant evaporator 125 provides vaporized refrigerant for adsorbing reactors. It should be understood that although a two-stage system is illustrated, any multiple stage system may be used to take advantage of the thermosyphon loop heat transfer advantages of the invention.

Figure 12:
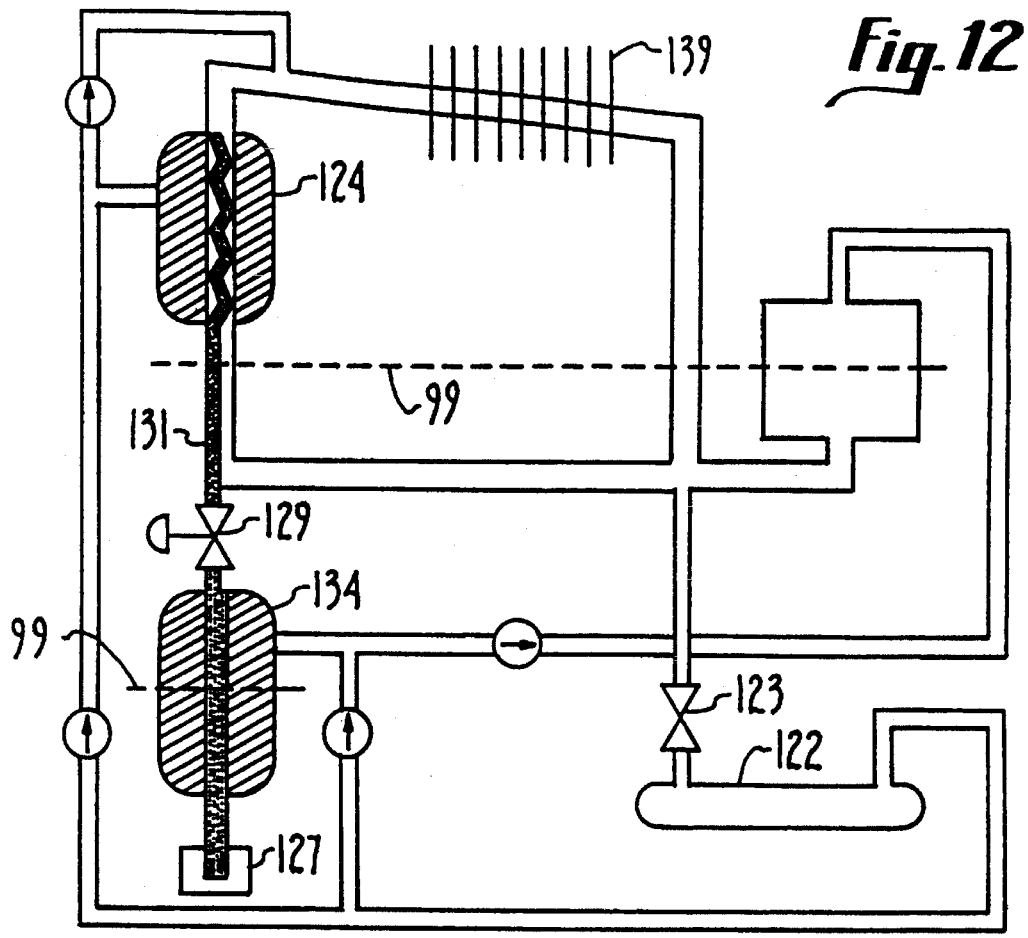
FIG. 12 shows a two-stage constant pressure engine staging system with first stage thermosyphon activated by second stage refrigerant pressure.

The system illustrated in FIG. 12 shows an example of the control of a heat rejection thermosyphon loop using refrigerant pressure across stages in contrast to the use of two sorbers in each stage as previously illustrated. Thus, in the discrete two-stage constant pressure system shown, refrigerant vapor from the second stage reactor 134 activates a heat rejection thermosyphon on first stage reactor 124 as adsorption occurs therein. Control of heat transfer fluid 131 shown stippled in the heat transfer pipe extending between the two reactors is accomplished using valve 129, which may be externally activated, such as a solenoid valve. A heat source 127 provides heat input to the heat transfer fluid for driving the desorption reactions of the system. Cold fill levels 99 are shown for the system as is evaporator 122, expansion device 123 and refrigerant condenser 139. Refrigerant vapor from the second stage reactor 134 activates the heat rejection thermosyphon of first stage reactor 124, which may incorporate a heat transfer section for cooling the reactor as previously described for lower stage reactors in FIG. 11. Activation may be pressure driven, as shown, or flow driven, i.e., bubble pump or ejector, or driven by a mechanical pump. Arrows illustrating liquid, gaseous and mixed phase refrigerant are not shown.

Figure 13:
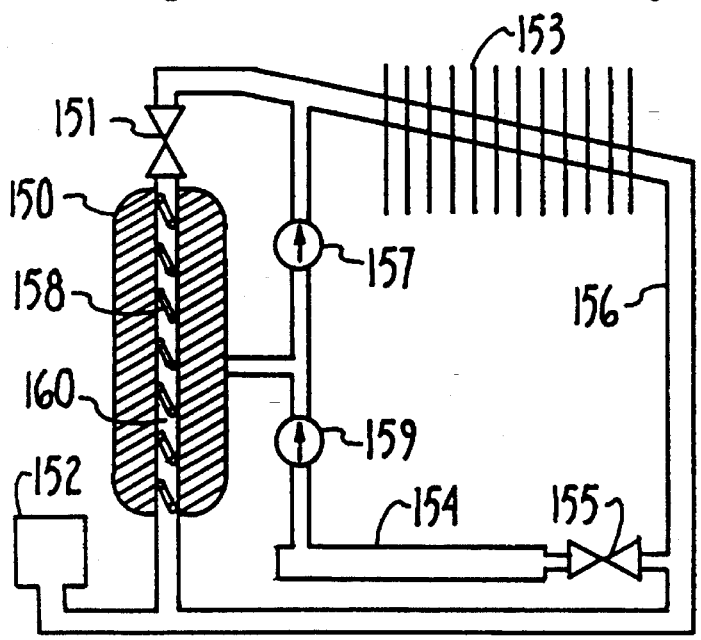
FIG. 13 illustrates a periodic refrigeration system with a heat rejection thermosyphon deactivated by a valve and refrigerant pressure.

In FIG. 13, an embodiment illustrating periodic refrigeration systems is shown, which uses a single reactor or sorber. Such a periodic single stage system features a thermosyphon loop for cooling the reactor during adsorption with valve 151 open to complete the heat rejecting thermosyphon loop to the condenser 153 and conduit 156 back to heat transfer section 160 of the reactor. During adsorption, liquid refrigerant is vaporized in the reactor heat transfer section and with the valve 151 open, the thermosyphon loop is activated. During desorption, by closing valve 151 and energizing heater 158, the thermosyphon is deactivated, and increased vapor pressure in heat transfer section 160 of the reactor forces liquid refrigerant out of the heat transfer tubes and completely deactivates the thermosyphon to prevent heat rejection. The system incorporates a reservoir 152 for liquid refrigerant, one way valves 157 and 159, evaporator 154, and expansion device 155. The reservoir may include a heater which is activated for displacing refrigerant therefrom. Alternatively, the reservoir may be replaced by a mechanical pump, or a vapor pump, assisted with a heater, and/or a check valve for driving liquid into the system. Again, arrows illustrating different refrigerant phases are not shown.

Figure 14:
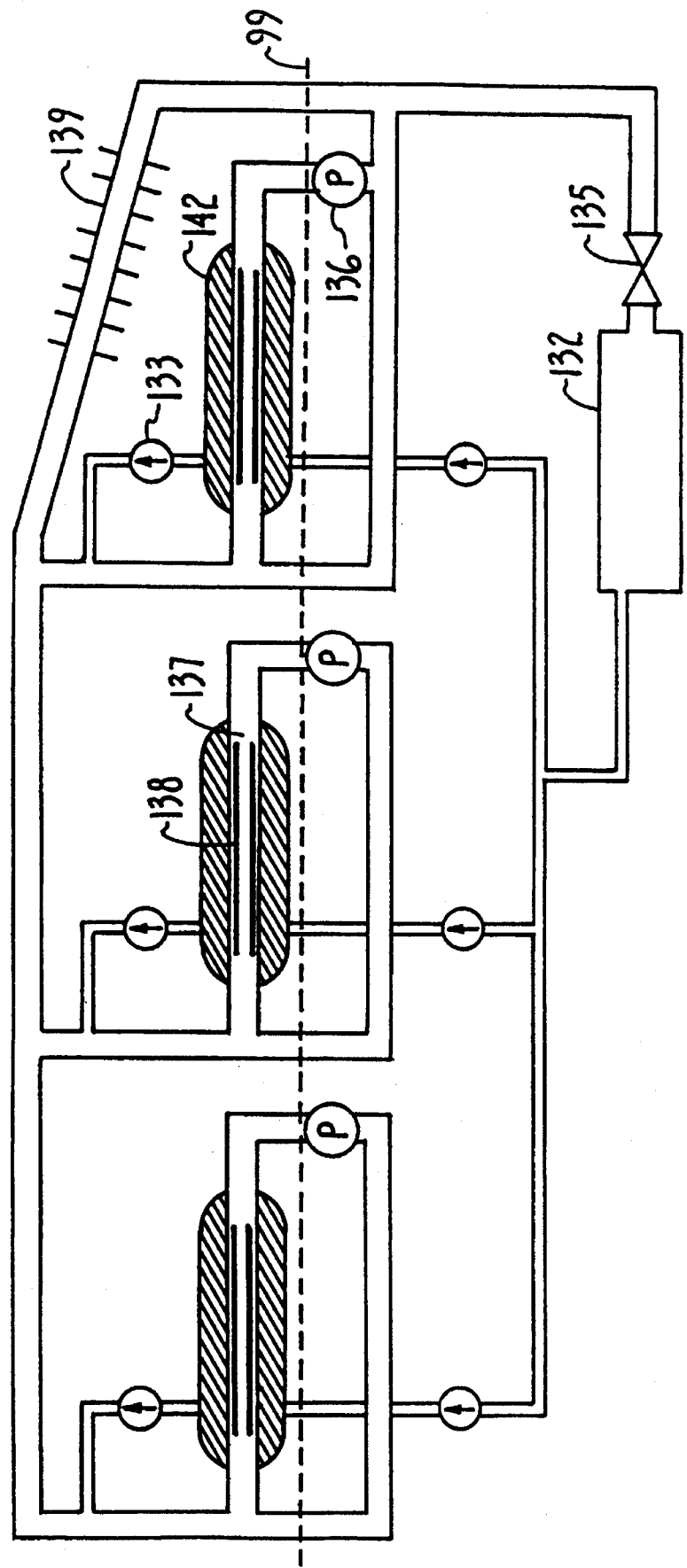
FIG. 14 shows a three reactor system using mechanical pumps for activating phase change cooling.

As disclosed herein thermosyphon loops for heat rejection are activated by pumping means such as bubble pump, vapor pump, ejector, or by fluid displacement. However, mechanical pumps may be used to activate phase-change thermosyphon systems for all of the above cycles by supplying a small amount of condensed coolant to the heat transfer surface. Such use of a mechanical pump may result in increased power density with proper cycle timing because heatup and cooldown can proceed simultaneously, and because adsorption and desorption periods need not be of equal duration as is required by desorption-driven pumping systems. Use of a mechanical pump also increases control options available. For example, when a thermostat indicates that cooling is no longer needed, the pump may be turned off and adsorption continued at a much lower rate to maintain load temperature without excessive cooling. Thermostatic demand for more cooling causes the pump to be activated and sorption rates would increase. During periods of low demand, desorption of the opposing sorber may also proceed without affecting performance of the adsorption, thus charging the system for the next call for cooling. In addition, three or more sorbers may be used to provide constant evaporator suction and reduce cycling losses due to refrigerant migration in the off periods or simply to provide backup or excess peak capacity. Such a system is illustrated in FIG. 14. Pumps 136 provide liquid refrigerant to heat transfer sections 137 of reactors 142. The system includes six check valves 133 along the gaseous refrigerant lines to and from the reactors, as shown. A condenser 139, evaporator 132, expansion valve 135 and reactor heaters 138 are also shown. The refrigerant phases within the system will be understood by reference to the systems illustrated in previous FIGS.

Figure 15:
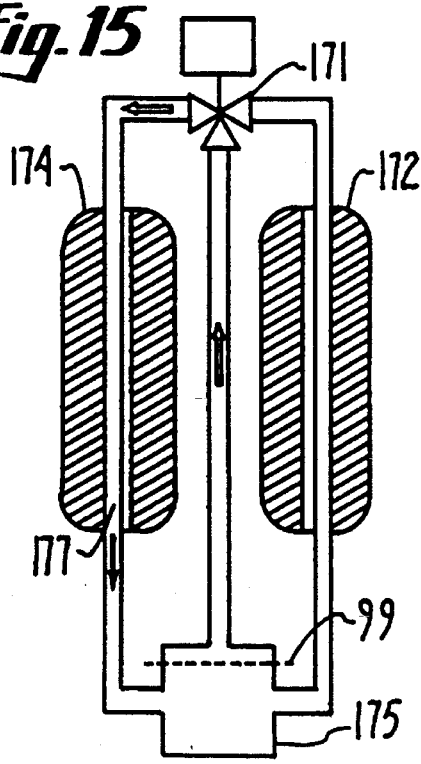
FIG. 15 illustrates a single-source means for heating a dual sorber system.

In small or miniature solid-vapor sorption refrigerators, freezers and refrigeration systems using multiple sorbers, electrical resistive heating elements are often used because of convenience and reduced size requirements. FIG. 15 shows an alternative apparatus design utilizing a single heat source and a single valve cooperating with heat transfer loops for controlling and directing the flow of heated vapor or a mixture of vapor and liquid phase heat transfer fluid to the sorbers at the desired time in the reaction cycle. The apparatus illustrated in FIG. 15 shows only the heat input circuit, but it may be used with any of the sorber cooling systems described hereinabove. In the device shown, a single heat source, for example gas flame, solar concentrator, campfire, electric element, and the like, vaporizes a heat transfer fluid in boiler 175, with single valve 171 directing the vapor to either sorber 172 or 174, at the desired time. Condensation of the vapor in the sorber generates heat which may be transferred to the sorbent utilizing a dual circuit heat transfer system as previously described, or by condensing the vapor in a small condenser tube 177 in contact with the sorber heat transfer surface. Condenser tube 177 may be straight as illustrated and bonded to one side of the heat transfer surface, or it may be coiled or concentric relative to the cooling channel of the heat transfer surface with axial fins connecting to the sorber as is commonly used in double-wall heat exchangers. In the device illustrated, vaporized heat transfer fluid from boiler 175 is directed to valve 171, which is positioned to direct the vapor to reactor 174, where it is condensed thereby releasing heat to drive desorption in the reactor. The condition of valve 171 is closed relative to reactor 172, in the adsorbing stage, and which may be cooled as previously described hereinabove. Such a means for heating may be used as an alternative to the conventional use of resistive electrical heating for small or miniaturized sorption refrigerators or refrigeration systems.

The systems of the invention disclosed herein are advantageous over prior art systems requiring the use of solenoid and/or thermostatically controlled components for operating and controlling the cooling loops for cooling adsorbing reactors. Instead, the systems of the present invention use vapor pumps, bubble pumps, mechanical pumps, or other vapor pressure displacement of the heat transfer fluid to activate the heat rejection loop. Moreover, systems of the present invention offer the advantage of using the system refrigerant as the heat transfer fluid in the thermosyphon cooling loop. The systems described herein may be used in any solid-vapor sorption refrigeration systems and applications. The invention finds particular advantage for small or miniature refrigeration engines, for example 5 to 25 watts cooling capacity, such as personal refrigerators and freezers, having few moving parts, and manufactured at relatively low cost. Because of the improvements and advantages of systems incorporating the apparatus and methods of the present invention, refrigerators, freezers, coolers and other appliances may incorporate and benefit from such inventions when incorporating such features of the invention, the resulting appliances will have substantially improved capacity including particularly noiseless and vibrationless operation while benefiting from reliable, simple, and inexpensive components, again due to the substantial reduction in the valves, pumps, and other power consuming components which are typically required in presently commercially available refrigerators, freezers, etc. More specifically, devices and appliances incorporating the components, methods and advantages of the present invention include small capacity refrigerators of between about 5 watts and 50 watts, and small capacity freezers of between about 5 watts and about 100 watts, having extreme temperature lifts. High specific power density low wattage cooling appliances of up to about 300 watts capacity may be constructed of components incorporating the present invention. Such small or personal refrigerator cooling around 0° C. to about 8° C. and freezers cooling at between about minus 30° and minus 10° C., and typically up to about 7 cubic feet are examples of such appliances. Other specific examples include high power, rapid freezing devices, such as disclosed in U.S. Pat. No. 5,161,389 or similar devices such as ice cream makers, ice cube makers, medical freezers and the like. Yet other cooling devices include air conditioning equipment, especially small room air conditioners of less than about 1.5 ton capacity or automotive or personal cooling devices, and the like. Other cooling apparatus which may be designed to incorporate the advantageous components and methods of the present invention include the electronic cooling systems disclosed in co-pending application Ser. No. 794,501 filed Nov. 19, 1991, the description of which is incorporated herein by reference. A list of specific types and examples of apparatus and appliances include:

- consumer leisure appliances, up to about 70 watts capacity, such as small or portable or personal freezers, refrigerators or refrigerator/freezer combination units, refrigerator, freezer or combination appliances which may be installed in recreational vehicles, boats, automobiles or trucks, and mini-bar refrigerators, freezers or combination units;
- kitchen appliances, up to about 400 watts, such as rapid freezers, standing alone or combined with microwave and/or standard refrigerator/freezer units, iced tea/coffee makers, ice cube makers, ice cream makers, freeze dryer units, and drink or water coolers;
- display and vending equipment and apparatus, up to about 500 watts, such as coolers, freezers and ice makers;
- durable good appliances, up to about 400 watts such as household refrigerators and freezers and commercial freezers and refrigerators, with or without rapid freeze capability, and dehumidifiers;
- building air conditioning appliances including residential split unit air conditioners and heat pumps (1 RT to 5 RT), light commercial split unit air conditioners and heat pumps (5 RT to 20 RT), room air conditioners (½ RT to 1½) and residential dehumidifiers;
- air conditioning and cooling systems for personal autos, vans or trucks, or for commercial vehicles such as buses, trains, aircraft, or pleasure or commercial boats and ships, including vehicle AC systems (1 RT to 2 RT), vehicle thermal storage systems (500 to 1000 w-hrs) and vehicular seat or bench cooling systems;
- electronic cooling apparatus, up to about 200 watts, for electronic and chip cooling and electronics system box air conditioning;
- miscellaneous equipment and appliances such as HVAC products in excess of 20 RT capacity, medical and laboratory appliances, military products including combat, pilot and astronaut suits, industrial and commercial heat pumps, boilers, thermal energy storage equipment, gas turbines, commercial dehumidifiers, aerospace cooling and refrigeration equipment, etc.

The above list is not intended to be exhaustive, but rather to give representative examples of specific types of apparatus that may incorporate the apparatus and methods of the present invention. These as well as other systems may incorporate the advantages and components of the present invention.

We claim:

1. In a sorption system comprising a plurality of reactors in which a gaseous refrigerant having a phase change from liquid to gas at or below the temperature of an adsorbing reactor is alternately adsorbed on and desorbed from an adsorbent material, a single condenser communicating with each of said plurality of reactors for condensing gaseous refrigerant directed thereto from all of said reactors, an evaporator for receiving refrigerant from said reactors, and a cooling loop, communicating with heat exchange sections of each of said reactors and with said condenser, a method of cooling an adsorbing reactor during adsorption comprising:

directing vaporized refrigerant from said adsorbing reactor to said condenser and condensing said refrigerant to provide liquid phase refrigerant, directing a portion of condensed refrigerant in said cooling loop to said adsorbing reactor, utilizing gaseous refrigerant from a desorbing reactor for driving said liquid phase refrigerant in said cooling loop to said adsorbing reactor and exposing said liquid phase refrigerant in heat exchange communication with said adsorbent material, and vaporizing at least a portion of said liquid phase refrigerant in said adsorbing reactor to provide said cooling.

2. The method of claim 1 including heating refrigerant in said system to provide pressure for driving said liquid phase refrigerant in said cooling loop to said adsorbing reactor.

3. In a sorption reaction system comprising one or more first reactors containing a solid adsorbent on which a gaseous refrigerant is alternately adsorbed and desorbed, and one or more second reactors containing a solid adsorbent on which a gaseous refrigerant is alternately desorbed and adsorbed, respectively, and having a cooling loop for directing heat transfer fluid to and from said reactors, said cooling loop containing a heat transfer fluid having a phase change from liquid to gas at or below the temperature of adsorption in said reactors, a first condenser for condensing vaporized heat transfer fluid, and a second condenser for condensing gaseous refrigerant, a method of cooling an adsorbing reactor comprising utilizing the pressure of gaseous heat transfer fluid from a desorbing reactor for assisting in forcing liquid heat transfer fluid in said cooling loop to an adsorbing reactor in heat exchange exposure to the adsorbent therein.

4. In a sorption system comprising one or more first reactors containing a solid sorbent on which a gaseous refrigerant is alternately adsorbed and desorbed, and one or more second reactors containing a solid adsorbent on which a gaseous refrigerant is alternately desorbed and adsorbed, respectively, said reactors including a heat transfer section in heat exchange communication with said solid adsorbent, said system including a single condenser for condensing gaseous refrigerant and in communication with each of said one or more first reactors and each of said one or more second reactors for receiving gaseous refrigerant therefrom, said system including a cooling loop for directing liquid refrigerant to and from said reactors, and wherein said refrigerant comprises a composition having a phase change from liquid to gas at a temperature at or below the temperature of an adsorbing reactor, a method of cooling an adsorbing reactor comprising:

directing liquid refrigerant condensed from said condenser to said cooling loop, pressurizing said cooling loop with pressure from gaseous refrigerant from a desorbing reactor and forcing said liquid refrigerant in said cooling loop to an adsorbing rector with said pressure.

5. The method of claim 3 including vaporizing liquid refrigerant by heating said liquid refrigerant in said cooling loop.

6. The method of claim 5 including providing one-way valve means along said cooling loop to prevent back flow of liquid refrigerant therein.

7. The method of claim 3 wherein said cooling loop includes a generally vertical conduit and wherein liquid refrigerant is driven upwardly along said generally vertical conduit by said gaseous refrigerant.

8. The method of claim 7 including heating said liquid refrigerant in said generally vertical conduit.

9. In a sorption reaction system comprising one or more first reactors in which a polar refrigerant is alternately adsorbed and desorbed on a complex compound, and one or more second reactors in which a polar refrigerant is alternately desorbed and adsorbed on a complex compound, respectively, wherein said complex compound is formed by adsorbing a polar gaseous refrigerant on a metal salt comprising a halide, nitrate, nitrite, oxalate, sulfate, or sulfite of an alkali metal, alkaline earth metal, transition metal, zinc, cadmium, tin, aluminum, sodium boroflouride, or double metal chloride and wherein said complex compound is formed by a method of increasing the chemisorption reaction rates between said polar refrigerant and said complex compound comprising restricting the volumetric expansion of the complex compound formed during at least the initial adsorption reaction to form a reaction product capable of increased chemisorption reaction rates as compared to a complex compound formed without restricting said volumetric expansion, said system having a cooling loop for directing heat transfer fluid to and from said reactors, a method of cooling an adsorbing reactor comprising directing liquid phase heat transfer fluid having a phase change from liquid to gas at a temperature at or below the temperature of adsorption to an adsorbing reactor in heat exchange exposure to the adsorbent therein utilizing vaporized heat transfer fluid for driving said liquid heat transfer fluid in said cooling loop.

10. The method of claim 9 wherein said heat transfer fluid comprises said refrigerant and wherein desorbed gaseous refrigerant is directed to said cooling loop from a desorbing reactor for driving liquid refrigerant to said adsorbing reactor.

11. The method of claim 10 wherein said liquid refrigerant is vaporized in said adsorbing reactor and directed to a condenser, and a portion of condensed refrigerant is directed to said cooling loop.

12. The method of claim 4 comprising utilizing an ejector pump driven by said gaseous refrigerant for directing said liquid refrigerant in said cooling loop.

13. The method of claim 3 comprising utilizing an ejector pump driven by said gaseous heat transfer fluid for directing said liquid heat transfer fluid in said cooling loop.

14. The method of claim 12 wherein said ejector pump is driven by a combination of refrigerant vapor generated by a heater and said desorbed gaseous refrigerant.

15. The method of claim 5 comprising utilizing a bubble pump driven by said gaseous refrigerant for directing said liquid refrigerant in said cooling loop.

16. The method of claim 3 comprising utilizing a bubble pump driven by said gaseous heat transfer fluid for directing said liquid heat transfer fluid in said cooling loop.

17. The method of claim 15 wherein said bubble pump is driven by a combination of refrigerant vapor generated by a heater and said desorbed gaseous refrigerant.

18. The method of claim 5 comprising utilizing an ejector pump driven by vapor from said vaporized refrigerant.

19. The method of claim 3 wherein said first and second reactors contain a complex compound formed by adsorbing a polar gaseous refrigerant on a metal salt comprising a halide, nitrate, nitrite, oxalate, sulfate, or sulfite of an alkali metal, alkaline earth metal, transition metal, zinc, cadmium, tin, aluminum, sodium boroflouride, or double metal chloride, and including a process for increasing chemisorption reaction rates between said polar gaseous refrigerant and said complex compound comprising restricting the volumetric expansion of the complex compound formed during at least the initial adsorption reaction to form a reaction product capable of increased chemisorption reaction rates as compared to a complex compound formed without restricting said volumetric expansion.

20. The method of claim 19 wherein said polar gaseous refrigerant is ammonia and said metal salt comprises $SrCl_2$, $SrBr_2$, $CaCl_2$, $CaBr_2$, $CaI_2$, $CoCl_2$, $CoBr_2$, $BaCl_2$, $BaBr_2$, $MgCl_2$, $MgBr_2$, $FeCl_2$, $FeBr_2$, $NiCl_2$, $ZnCl_2$, $SnCl_2$, $MnCl_2$, $MnBr_2$, or $CrCl_2$ or mixtures thereof.

21. In a sorption reaction system comprising one or more first reactors in which a refrigerant is alternately adsorbed and desorbed, and one or more second reactors in which said refrigerant is alternately desorbed and adsorbed, said first and second reactors having a heat transfer section in heat exchange communication with adsorbent composition on which said refrigerant is adsorbed and desorbed, and a condenser for condensing vaporized heat transfer fluid, a method of cooling an adsorbing reactor comprising:
providing a thermosyphon loop communicating the heat transfer section of each of said first reactors with the heat transfer section of a different one of said second reactors, providing a heat transfer fluid having a phase change from liquid to gas at a temperature at or below the temperature of adsorption, and utilizing the pressure of vaporized heat transfer fluid from a desorbing reactor for assisting in forcing liquid heat transfer fluid into the heat transfer section of an adsorbing reactor to provide cooling therein.

22. The method of claim 21 wherein said heat transfer fluid comprises said refrigerant, said method comprising deactivating the thermosyphon loop in said desorbing reactor by directing pressurized desorbed gaseous refrigerant from said desorbing reactor through the heat transfer section of said desorbing reactor, and forcing liquid refrigerant from said heat transfer section with said desorbed gaseous refrigerant.

23. The method of claim 22 wherein the desorbed gaseous refrigerant is pressurized by heating said desorbing reactor with first heating means for driving the desorption reaction.

24. The method of claim 23 comprising energizing said first heating means for displacing liquid refrigerant from said heat transfer section, and thereafter for creating pressure in said thermosyphon loop from the desorbed gaseous refrigerant.

25. The method of claim 22 wherein said thermosyphon loop includes first and second conduits communicating between said condenser and said first and second reactors, respectively, each of said first and second conduits including a valve operated for opening and closing said first and second conduits, said method including closing the valve communicating a desorbing reactor with the condenser during the desorption reaction whereby desorbed gaseous refrigerant is directed through said heat transfer section of said desorbing reactor for forcing said liquid refrigerant therefrom.

26. The method of claim 25 wherein said valve is operated by refrigerant vapor pressure from a desorbing reactor for closing the conduit communicating said desorbing reactor and the condenser.

27. The method of claim 23 wherein said system includes second heating means for heating refrigerant in said thermosyphon loop, said method including energizing said second heating means to increase vapor pressure for deactivating said thermosyphon loop in a desorbing reactor until said first heating means creates sufficient desorbed refrigerant vapor pressure for deactivating said thermosyphon.

28. The method of claim 21 wherein the heat transfer fluid is pressurized by heating with first heating means in said desorbing reactor for driving the desorption reaction.

29. The method of claim 21 wherein said thermosyphon loop includes first and second conduits communicating between said condenser and said first and second reactors, respectively, each of said first and second conduits including a valve operated for opening and closing said first and second conduits, said method including closing the valve communicating a desorbing reactor with the condenser during the desorption reaction whereby vaporized heat transfer fluid is directed through said heat transfer section of said desorbing reaction for forcing said liquid heat transfer fluid therefrom.

30. The method of claim 29 wherein said valve is operated by refrigerant vapor pressure from a desorbing reactor for closing the conduit communicating said desorbing reactor and the condenser.

31. The method of claim 28 wherein said system includes second heating means for heating vaporized heat transfer fluid in said thermosyphon loop, said method including energizing said second heating means to increase vapor pressure for deactivating said thermosyphon loop in a desorbing reactor until said first heating means creates sufficient vapor pressure for deactivating said thermosyphon loop.

32. The method of claim 22 wherein said heat transfer fluid comprises said refrigerant, said method including activating the thermosyphon loop comprising utilizing pressurized refrigerant vapor for forcing liquid refrigerant in said thermosyphon loop to an adsorbing reactor.

33. The method of claim 32 comprising utilizing desorbed gaseous refrigerant from a desorbing reactor for forcing liquid refrigerant in said thermosyphon loop.

34. The method of claim 33 wherein said system includes a reservoir for receiving liquid refrigerant and a heater cooperating therewith, said reservoir communicating with a conduit for directing desorbed gaseous refrigerant from a reactor and with said thermosyphon loop, said method including energizing said heater for pressurizing refrigerant vapor in said reservoir and displacing liquid refrigerant therefrom into said thermosyphon loop.

35. The method of claim 34 comprising energizing said heater prior to desorbing gaseous refrigerant in a desorbing reactor.

36. The method of claim 21 wherein said system includes a reservoir for receiving liquid refrigerant and a heater cooperating therewith, said method including energizing said heater for pressurizing refrigerant vapor in said reservoir and displacing liquid refrigerant therefrom into said thermosyphon loop.

37. The method of claim 32 wherein said system includes a reservoir for receiving condensed refrigerant, and a heater in said thermosyphon loop, said method including energizing said heater for vaporizing liquid refrigerant thereby forcing liquid refrigerant in said thermosyphon loop to an adsorbing reactor.

38. The method of claim 21 wherein said refrigerant and said heat transfer fluid comprise different compositions and wherein said system includes first conduits for directing refrigerant to and from said reactors and second conduits for directing heat transfer fluid therein, and movable interface means cooperating with said first and second conduits for forcing heat transfer fluid into said thermosyphon loop in response to refrigerant vapor pressure on said movable interface means, said method including generating sufficient refrigerant vapor pressure from a desorbing reactor to activate said thermosyphon loop.

39. The method of claim 38 wherein said movable interface means includes a reservoir for receiving liquid heat transfer fluid and a heater cooperating therewith, said method including energizing said heater for pressurizing refrigerant vapor on one side of said movable interface means thereby moving said interface means for displacing liquid heat transfer fluid from said reservoir into said thermosyphon loop.

40. The method of claim 21 wherein said refrigerant and said heat transfer fluid comprise different compositions, said system including first conduits for directing refrigerant to and from said reactors and second conduits for directing heat transfer fluid therein, and a reservoir for receiving liquid heat transfer fluid and cooperating with said first and second conduits for forcing heat transfer fluid into said thermosyphon loop, said method including heating said reservoir for displacing liquid heat transfer fluid therefrom into said thermosyphon loop.

41. The method of claim 21 wherein said first and second reactors contain a complex compound formed by adsorbing a polar gaseous refrigerant on a metal salt comprising a halide, nitrate, nitrite, oxalate, sulfate, or sulfite of an alkali metal, alkaline earth metal, transition metal, zinc, cadmium, tin, aluminum, sodium boroflouride, or double metal chloride, said method including a process for increasing chemisorption reaction rates between said polar gaseous refrigerant and said complex compound comprising restricting the volumetric expansion of the complex compound formed during at least the initial adsorption reaction to form a reaction product capable of increased chemisorption reaction rates as compared to a complex compound formed without restricting said volumetric expansion.

42. The method of claim 41 wherein said polar gaseous refrigerant is ammonia and said metal salt comprises $SrCl_1$, $SrBr_2$, $CaCl_2$, $CaBr_2$, $CaI_2$, $CoCl_2$, $CoBr_2$, $BaCl_2$, $BaBr_2$, $MgCl_2$, $MgBr_2$, $FeCl_2$, $FeBr_2$, $NiCl_2$, $ZnCl_2$, $SnCl_2$, $MnCl_2$, $MnBr_2$, or $CrCl_2$ or mixtures thereof.

43. In operation of a sorption reaction system comprising one or more reactors in which a refrigerant is alternately adsorbed and desorbed on a solid adsorbent, wherein said solid adsorbent comprises a complex compound formed by adsorbing a polar gaseous refrigerant on a metal salt comprising a halide, nitrate, nitrite, oxalate, sulfate, or sulfite of an alkali metal, alkaline earth metal, transition metal, zinc, cadmium, tin, aluminum, sodium boroflouride, or double metal chloride, wherein said complex compound is formed by a process for increasing the chemisorption reaction rates between said polar gaseous refrigerant and said complex compound by restricting the volumetric expansion of the complex compound during at least the initial adsorption reaction to form a reaction product mass capable of increased chemisorption reaction rates as compared to a complex compound formed without restricting said volumetric expansion, and conduit means for directing a heat transfer fluid from said one or more reactors to a condenser and from said condenser to said one or more reactors, a method of rejecting heat of adsorption from an adsorbing reactor comprising:

providing a liquid phase heat transfer fluid having a phase change from a liquid to gas at or below the temperature of an adsorbing reactor in said conduit means, providing vapor pressure for displacing said heat transfer fluid in said conduit means between said condenser and said one or more reactors thereby directing liquid heat transfer fluid to said adsorbing reactor, and vaporizing at least a portion of said liquid heat transfer fluid in said adsorbing reactor.

44. The method of claim 43 wherein said polar gaseous refrigerant is ammonia and said metal salt comprises $SrCl_2$, $SrBr_2$, $CaCl_2$, $CaBr_2$, $CaI_2$, $CoCl_2$, $CoBr_2$, $BaCl_2$, $BaBr_2$, $MgCl_2$, $MgBr_2$, $FeCl_2$, $FeBr_2$, $NiCl_2$, $ZnCl_2$, $SnCl_2$, $MnCl_2$, $MnBr_2$, or $CrCl_2$ or mixtures thereof.

45. In operation of a sorption reaction system comprising one or more first reactors in which a refrigerant is alternately adsorbed and desorbed on a solid adsorbent, one or more second reactors in which said refrigerant is alternately desorbed and adsorbed on a solid adsorbent, respectively, wherein said adsorbent comprises a complex compound formed by adsorbing a polar gaseous refrigerant on a metal salt comprising a halide, nitrate, nitrite, oxalate, sulfate, or sulfite of an alkali metal, alkaline earth metal, transition metal, zinc, cadmium, tin, aluminum, sodium boroflouride, or double metal chloride, wherein said complex compound is formed by a process for increasing the chemisorption reaction rates between said polar gaseous refrigerant and said complex compound by restricting the volumetric expansion of the complex compound during at least the initial adsorption reaction to form a reaction product mass capable of increased chemisorption reaction rates as compared to a complex compound formed without restricting said volumetric expansion an evaporator for evaporating liquid refrigerant, and a condenser for condensing gaseous refrigerant, a method of rejecting heat of adsorption from an adsorbing reactor comprising:

exposing liquid refrigerant having a phase change from liquid to gas at or below the temperature of adsorption of said refrigerant on said solid adsorbent in heat exchange exposure to said solid adsorbent in an adsorbing reactor, vaporizing at least a portion of said liquid refrigerant, directing vaporized refrigerant to said condenser, and directing a portion of condensed refrigerant to said adsorbing reactor and a portion of condensed refrigerant to said evaporator.

46. The method of claim 45 wherein each of said first and second reactors contain a different complex compound therein, said method including directing at least a portion of the heat from an exothermic adsorption reaction to a endothermic desorption reactor for driving the reaction therein.

47. The method of claim 45 wherein said reaction system comprises three or more reactors, each reactor containing a different complex compound therein, each of said different complex compounds having a different gaseous vapor pressure substantially independent of the concentration of gaseous reactant, said method including directing heat transfer fluid between reactors containing the next successive higher and next successive lower vapor pressure complex compounds.

48. A sorption reaction system apparatus comprising one or more first reactors and one or more second reactors, said reactors containing a solid adsorbent for alternately adsorbing and desorbing a refrigerant thereon, said reactors including reactor heat exchange means for directing a heat transfer fluid in heat exchange exposure to said adsorbent, means for heating said first and second reactors, a condenser, a refrigerant evaporator, a heat rejection conduit loop communicating with said reactor heat exchange means of each of said reactors for rejecting heat from said one or more first and second reactors during adsorption therein, said loop including a first loop portion for directing vaporized heat transfer fluid from said heat exchange means of an adsorbing reactor to said condenser, and a second loop portion for returning condensed heat transfer fluid from said condenser to said heat exchange means of said adsorbing reactor, a heat transfer fluid located in said heat rejection conduit loop capable of a phase change from liquid to gas at a temperature at or below the temperature of adsorption in an adsorbing reactor, and vapor operated fluid displacement means cooperating with said second portion of said heat rejection conduit loop for displacing liquid phase heat transfer fluid therefrom to adsorbing reactor heat exchange means, and including one or more gas pressure conduits communicating a desorbing reactor with said heat rejection conduit loop for pressurizing said loop with desorbed gaseous refrigerant or vaporized heat transfer fluid from a desorbing reactor.

49. The apparatus of claim 48 wherein said heat transfer fluid is the same composition as said refrigerant.

50. The apparatus of claim 48 wherein said fluid displacement means comprises a gas operated pump driven by pressure from said vaporized heat transfer fluid or gaseous refrigerant.

51. The apparatus of claim 50 wherein said pump comprises a bubble pump having a generally vertical pipe containing liquid phase heat transfer fluid communicating with said reactor heat exchange means and with said one or more gas pressure conduits for directing vaporized heat transfer fluid or desorbed gaseous refrigerant to drive said liquid phase heat exchange fluid along said vertical pipe.

52. The apparatus of claim 48 wherein said fluid displacement means comprises a reservoir for holding liquid heat transfer fluid and includes one or more ejectors for pumping liquid refrigerant from said reservoir to said reactors.

53. The apparatus of claim 48 wherein said fluid displacement means comprises a heater cooperating with said second portion of said heat rejection conduit loop for heating liquid heat transfer fluid or refrigerant therein for pumping liquid heat transfer fluid or refrigerant to reactor heat exchange means for cooling an adsorbing reactor.

54. The apparatus of claim 53 including first one-way valves for preventing back flow of heated liquid heat transfer fluid or refrigerant along said second portion of said heat rejection conduit loop.

55. The apparatus of claim 48 including passageway means for directing desorbed gaseous refrigerant from said solid adsorbent to said reactor heat exchange means.

56. The apparatus of claim 55 including a selectively operated valve cooperating with said passageway means and said first portion of said heat rejection conduit loop for selectively directing desorbed gaseous refrigerant to said reactor heat exchange means during reactor desorption, and selectively directing vaporized refrigerant from a reactor to a condenser during reactor adsorption.

57. The apparatus of claim 55 including pressure operated valves cooperating with said first portion of said heat rejection conduit loop and said passageway means and responsive to desorbed refrigerant pressure for closing during reactor desorption thereby directing desorbed gaseous refrigerant to said reactor heat exchange means during reactor desorption, and for opening during reactor adsorption thereby directing vaporized refrigerant from a reactor to a condenser.

58. The apparatus of claim 48 wherein said condenser comprises first and second condensers, said first condenser communicating with said heat rejection conduit loop for condensing said heat transfer fluid, and said second condenser communicating with a gas pressure conduit for condensing desorbed refrigerant.

59. The apparatus of claim 58 including selectively operated valve means cooperating with said heat rejection conduit loop for selectively directing vaporized heat transfer fluid from a reactor to said first condenser during reactor adsorption and for pressurizing said conduit loop with vaporized heat transfer fluid from a desorbing reactor heat exchange means during reactor desorption.

60. The apparatus of claim 48 wherein said fluid displacement means comprises a movable interface means responsive to vapor pressure on a first side thereof for displacing liquid on the second side thereof.

61. The apparatus of claim 60 wherein said fluid displacement means includes a reservoir cooperating with said movable interface means.

62. The apparatus of claim 61, wherein said reservoir communicates with said one or more gas pressure conduits for receiving desorbed gaseous refrigerant therein, and with said condenser for receiving condensed heat transfer fluid.

63. The apparatus of claim 62 wherein said movable interface means comprises a diaphragm positioned in said reservoir.

64. The apparatus of claim 48, wherein said fluid displacement means comprises one or more reservoirs for holding liquid heat transfer fluid and communicating with said reactors via said second portion of said heat rejection conduit loop for directing said heat transfer fluid therefrom to an adsorbing reactor, and wherein said one or more gas pressure conduits cooperate with said one or more reservoirs for receiving desorbed gaseous refrigerant from a desorbing reactor.

65. The apparatus of claim 64 wherein said one or more reservoirs includes a heater cooperating therewith for heating refrigerant for displacing liquid heat transfer fluid from said reservoir to said reactor heat exchange means.

66. The apparatus of claim 48 wherein said first and second reactors contain a complex compound formed by adsorbing a polar gaseous refrigerant on a metal salt comprising a halide, nitrate, nitrite, oxalate, sulfate, or sulfite of an alkali metal, alkaline earth metal, transition metal, zinc, cadmium, tin, aluminum, sodium boroflouride, or double metal chloride, and prepared by a method for increasing adsorption and desorption reaction rates by restricting the volumetric expansion of the complex compound during at least the initial adsorption reaction and capable of increased adsorption and desorption reaction rates as compared to a complex compound formed without restricting said volumetric expansion.

67. The apparatus of claim 66 wherein each of said first and second reactors contain a different complex compound therein, each of said different complex compounds having a different gaseous reactant vapor pressure, substantially independent of the concentration of gaseous reactant.

68. The apparatus of claim 48 including a single heating source for vaporizing liquid heat transfer fluid, a three-way valve for selectively directing vaporized heat transfer fluid to said first and said second reactors, respectively, and conduit means communicating between said single heat source and said three-way valve member for directing vaporized refrigerant from said heat source to said valve.

69. The apparatus of claim 68 wherein said first and said second reactors include a heat transfer section in heat transfer communication with said solid adsorbent for condensing said vaporized heat transfer fluid.

70. The apparatus of claim 67 comprising a plurality of three or more reactors each having a different complex compound therein, said different complex compounds having an ascending order of gaseous reactant vapor pressure with the adsorbing temperature of a lower vapor pressure complex compound at a low reaction pressure being higher than the desorption temperature of the next successive higher vapor pressure complex compound at a high reaction pressure, and including means for directing heat transfer fluid between said reactors for rejecting heat of adsorption from the highest temperature reactor to the next lower temperature reactor.

71. The apparatus of claim 70 wherein said polar gaseous refrigerant is ammonia and said metal salt comprises $SrCl_2$, $SrBr_2$, $CaCl_2$, $CaBr_2$, $CaI_2$, $CoCl_2$, $CoBr_2$, $BaCl_2$, $BaBr_2$, $MgCl_2$, $MgBr_2$, $FeCl_2$, $FeBr_2$, $NiCl_2$, $ZnCl_2$, $SnCl_2$, $MnCl_2$, $MnBr_2$ or $CrCl_2$ or mixtures thereof.

72. The apparatus of claim 71 wherein said heat transfer fluid comprises said ammonia refrigerant.

73. A periodic sorption reaction system apparatus comprising a reactor containing a solid adsorbent for alternately adsorbing and desorbing a refrigerant thereon, said reactor including a reactor heat transfer section for directing liquid refrigerant in heat exchange exposure to said adsorbent, said refrigerant capable of a phase change from liquid to gas at a temperature at or below the temperature of adsorption in said reactor, means for heating said reactor, a condenser, an evaporator, a first conduit communicating between said reactor heat exchange means and said condenser and a selectively operated valve cooperating therewith for selectively opening said first conduit during reactor adsorption for directing vaporized refrigerant from said reactor heat transfer section to said condenser and closing said first conduit during reactor desorption, fluid displacement means for directing liquid refrigerant to reactor heat exchange means, and second conduit means and a one-way valve cooperating therewith for directing gaseous refrigerant from said evaporator to said reactor for adsorption on said adsorbent, third conduit means and a one-way valve cooperating therewith for directing desorbed gaseous refrigerant from said reactor to said condenser and fourth conduit means communicating between said reactor heat transfer section and said fluid displacement means.

74. The apparatus of claim 73 wherein said fluid displacement means includes a reservoir for holding liquid refrigerant.

75. The apparatus of claim 74 wherein said fluid displacement means comprises a mechanical pump or a vapor pump.

76. The apparatus of claim 75 wherein said fluid displacement means comprises a vapor pump and includes a heater and a one-way valve cooperating therewith for directing fluid therefrom.

77. The method of claim 20 wherein said complex compound forms at least a partially structurally immobilized, self-supporting, coherent reaction product mass.

78. The method of claim 44 wherein said complex compound forms at least a partially structurally immobilized, self-supporting, coherent reaction product mass.

79. The method of claim 71 wherein said complex compound forms at least a partially structurally immobilized, self-supporting, coherent reaction product mass.

80. The apparatus of claim 65 wherein said heat transfer fluid comprises said refrigerant, and wherein said condenser communicates with said heat rejection conduit loop and said one or more reservoirs for supplying condensed refrigerant thereto.

81. The apparatus of claim 67 wherein heat of adsorption in a lower stage, cooler temperature reactor is rejected by condensed refrigerant in said reactor heat exchange means, and heat of adsorption in a higher stage, hotter temperature reactor is rejected by liquid heat transfer fluid in said reactor heat exchange means, and wherein said heat rejection loop includes one or more refrigerant conduits cooperating with said reactor heat exchange means for circulating refrigerant from the cooler temperature reactor heat exchange means to said condenser and back to said cooler temperature reactor heat exchange means, and one or more heat transfer fluid conduits for directing heat transfer fluid between the heat exchange means of a higher temperature reactor and a lower temperature reactor.

82. In a sorption system comprising a plurality of reactors in which a gaseous refrigerant is alternately adsorbed on and desorbed from an adsorbent material and having a common condenser for condensing gaseous refrigerant desorbed from all of said plurality of reactors and a cooling loop for directing condensed refrigerant to each of said reactors, said refrigerant having a phase change from liquid to gas at or below the temperature of said reactors during adsorption, a method of cooling an adsorbing reactor during adsorption comprising:

pumping condensed refrigerant from said condenser to said reactors along said cooling loop during adsorption using one or more mechanical pumps and exposing said condensed refrigerant in heat exchange communication with said adsorbent material, and vaporizing at least a portion of said liquid phase refrigerant in said one or more adsorbing reactors.

83. The method of claim 82 including directing vaporized refrigerant from said adsorbing reactors to said condenser and directing a portion of condensed refrigerant to an evaporator.

84. In a sorption system of claim 4, wherein said cooling loop communicates with heat transfer sections in each of said one or more first and second reactors in heat exchange communication with said solid adsorbent therein, said method including directing vaporized refrigerant from the heat transfer section of an adsorbing reactor to said condenser, condensing said vaporized refrigerant, and directing said condensed refrigerant back to the heat transfer section of said adsorbing reactor through said cooling loop.

85. The method of claim 9 including vaporizing heat transfer fluid by heating said liquid heat transfer fluid in said cooling loop.

86. The method of claim 85 including providing one-way valve means along said cooling loop to prevent back flow of liquid heat transfer fluid therein.

87. The method of claim 9 wherein said cooling loop includes a generally vertical conduit and wherein liquid heat transfer fluid is driven upwardly along said generally vertical conduit by said vaporized heat transfer fluid.

\* \* \* \* \*